US012805136B2

(12) United States Patent
Bae et al.

(10) Patent No.: US 12,805,136 B2
(45) Date of Patent: Nov. 17, 2026

(54) DISPLAY DEVICE

(71) Applicant: Samsung Display Co., LTD., Yongin-si (KR)

(72) Inventors: Chul Min Bae, Yongin-si (KR); Soo Jin Jung, Yongin-si (KR); Ji Hye Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/926,646

(22) Filed: Oct. 25, 2024

(65) Prior Publication Data

US 2025/0212633 A1 Jun. 26, 2025

(30) Foreign Application Priority Data

Dec. 26, 2023 (KR) ........................ 10-2023-0191541

(51) Int. Cl.
*H10K 59/131* (2023.01)
*G09G 3/00* (2006.01)
*G09G 3/3225* (2016.01)

(52) U.S. Cl.
CPC ........... *H10K 59/131* (2023.02); *G09G 3/001* (2013.01); *G09G 3/3225* (2013.01); *G09G 2300/0842* (2013.01); *G09G 2330/028* (2013.01)

(58) Field of Classification Search
CPC .. H10K 59/131; H10K 59/121; H10K 59/122; H10K 59/35; G09G 3/001; G09G 3/3266; G09G 3/3225
See application file for complete search history.

(56) References Cited

U.S. PATENT DOCUMENTS

| | | | | |
|---|---|---|---|---|
| 10,784,320 | B2 * | 9/2020 | Park | H10K 59/35 |
| 11,489,135 | B2 * | 11/2022 | Yoo | H10K 50/16 |
| 11,659,736 | B2 * | 5/2023 | Yoon | H10K 59/12 257/89 |
| 2013/0047920 | A1 | 2/2013 | Ro et al. | |
| 2014/0042400 | A1 * | 2/2014 | Kim | H10K 59/131 257/40 |
| 2016/0118449 | A1 * | 4/2016 | Sato | H10K 50/805 257/89 |
| 2018/0331315 | A1 * | 11/2018 | Maeda | H10K 59/131 |
| 2020/0193917 | A1 * | 6/2020 | Park | G09G 3/3266 |
| 2023/0247873 | A1 * | 8/2023 | Kubota | H10K 59/131 257/40 |
| 2025/0344589 | A1 * | 11/2025 | Katayama | H10K 59/80515 |

FOREIGN PATENT DOCUMENTS

| | | | |
|---|---|---|---|
| KR | 10-1405502 | 6/2014 | |
| WO | WO-2023012571 A1 * | 2/2023 | H10K 59/80521 |

* cited by examiner

*Primary Examiner* — Sardis F Azongha
(74) *Attorney, Agent, or Firm* — Womble Bond Dickinson (US) LLP

(57) ABSTRACT

A display device includes a display area and a non-display area, sub-pixels disposed in the display area, and a metal line intersecting the non-display area and the display area and spaced apart from emission areas of the sub-pixels on a plane in the display area, and a voltage including pulses is applied to the metal line, and is increased by a step voltage value for each of the pulses.

20 Claims, 15 Drawing Sheets

VM

DISPLAY DEVICE

CROSS-REFERENCE TO RELATED APPLICATION(S)

This application claims priority to and benefits of Korean Patent Application No. 10-2023-0191541 under 35 U.S.C. § 119, filed on Dec. 26, 2023 in the Korean Intellectual Property Office, the entire contents of which are incorporated herein by reference.

BACKGROUND

1. Technical Field

The disclosure relates to a display device.

2. Description of the Related Art

As information technology develops, importance of a display device, which is a connection medium between a user and information, is emerging. In response to this, a use of a display device such as a liquid crystal display device and an organic light emitting display device is increasing.

The display device displays an image using pixels. In order to implement augmented reality (AR), a virtual reality (VR), and mixed reality (MR), more pixels are required to be disposed on a small display screen in the display device.

As a distance between the pixels narrows, a leakage current through a common layer of adjacent pixels may become a problem.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

A technical object to be solved is to provide a display device and a wearable device capable of preventing a leakage current through a common layer between adjacent pixels.

According to an embodiment of the disclosure, a display device may include a display area and a non-display area; sub-pixels disposed in the display area; and a metal line intersecting the non-display area and the display area and spaced apart from emission areas of the sub-pixels on a plane in the display area; and a voltage including a plurality of pulses is applied to the metal line, and is increased by a step voltage value for each of the plurality of pulses.

In an embodiment, pulse amplitudes of the plurality of pulses may be equal to each other.

In an embodiment, the display device may further include a first metal pad disposed in the non-display area and electrically connected to an end of the metal line, and a second metal pad disposed in the non-display area and electrically connected to another end of the metal line, the display area is disposed between the first metal pad and the second metal pad, and the voltage including the plurality of pulses is applied to the metal line through the first metal pad.

In an embodiment, the metal line may be disposed on a pixel defining layer that defines the emission areas of the sub-pixels in the display area.

In an embodiment, the metal line may electrically contact a cathode of a light emitting element of the sub-pixels.

According to an embodiment of the disclosure, a display device may include a display area and a non-display area; sub-pixels disposed in the display area; and a first sub-metal line and a second sub-metal line intersecting the non-display area and the display area and spaced apart from emission areas of the sub-pixels on a plane in the display area, and the first sub-metal line and the second sub-metal line are disposed on a substrate in a vertical direction.

In an embodiment, the first sub-metal line may be disposed on a pixel defining layer defining the emission areas of the sub-pixels in the display area, and the second sub-metal line is disposed inside of the pixel defining layer.

In an embodiment, the display device may further include a pixel circuit layer disposed on the substrate and including a sub-pixel circuit of each of the sub-pixels, a via layer disposed on the pixel circuit layer, and a light emitting element layer disposed on the via layer and including the pixel defining layer, and the second sub-metal line is contacts an upper surface of the via layer.

In an embodiment, the display device may further include a pixel circuit layer disposed on the substrate, the pixel circuit layer including a sub-pixel circuit of each of the sub-pixels, a via layer disposed on the pixel circuit layer, and a light emitting element layer disposed on the via layer, the light emitting element layer including the pixel defining layer, and the second sub-metal line is spaced apart from the via layer and disposed inside of the pixel defining layer.

In an embodiment, the second sub-metal line may be formed of a plurality of lines.

In an embodiment, the display device may further include a first metal pad disposed in the non-display area and electrically connected to an end of the first sub-metal line and an end of the second sub-metal line, and a second metal pad disposed in the non-display area and electrically connected to another end of the first sub-metal line and another end of the second sub-metal line, and the display area is disposed between the first metal pad and the second metal pad.

In an embodiment, the first metal pad may further include a first sub-metal pad and a second sub-metal pad, the end of the first sub-metal line is electrically connected to the first sub-metal pad, the end of the second sub-metal line is electrically connected to the second sub-metal pad, and separate voltages are applied to the first sub-metal pad and the second sub-metal pad.

In an embodiment, a voltage including a plurality of pulses may be applied to the first metal pad, and is increased by a step voltage value for each of plurality of pulses, and a voltage including a single pulse is applied to the second metal pad.

In an embodiment, the first sub-metal line may electrically contact a cathode of light emitting elements of the sub-pixels.

The display device may be a head mounted display device.

A display device and a wearable device according to the disclosure may prevent a leakage current through a common layer between adjacent pixels and prevent damage to the adjacent pixels.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
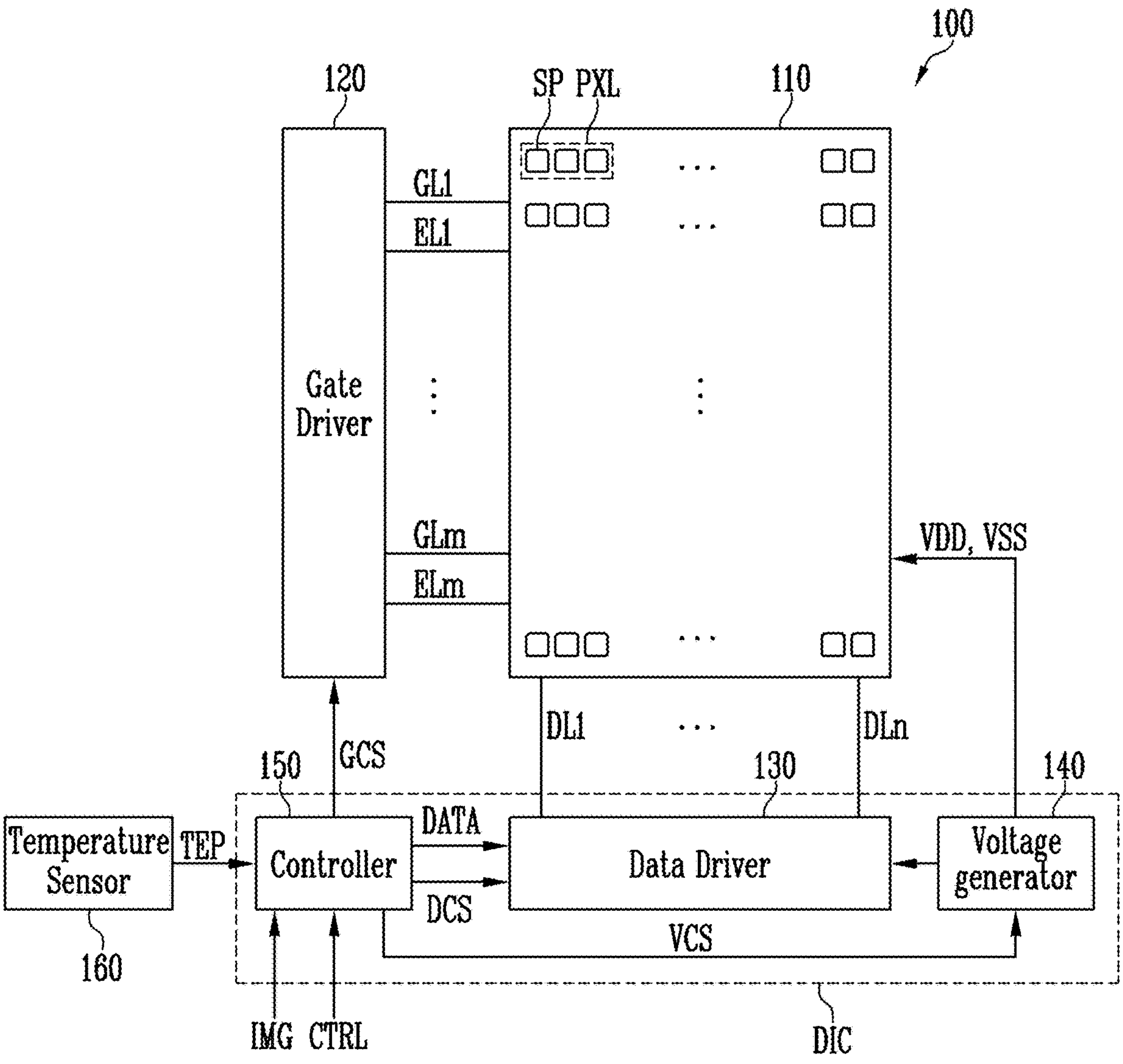
FIG. 1 is a block diagram illustrating an embodiment of a display device.

Hereinafter, various embodiments of the disclosure will be described in detail with reference to the accompanying drawings so that those skilled in the art may readily carry out the disclosure. The disclosure may be implemented in various different forms and is not limited to the embodiments described herein.

In order to clearly describe the disclosure, parts that are not related to the description are omitted, and the same or similar elements are denoted by the same reference numerals throughout the specification. Therefore, the above-described reference numerals may be used in other drawings.

In addition, sizes and thicknesses of each component shown in the drawings are arbitrarily shown for convenience of description, and thus the disclosure is not necessarily limited to those shown in the drawings. In the drawings, thicknesses may be exaggerated to clearly express various layers and areas.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "comprises," "comprising," "includes," and/or "including," "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Embodiments may be described and illustrated in the accompanying drawings in terms of functional blocks, units, and/or modules.

Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies.

In the case of the blocks, units, and/or modules being implemented by microprocessors or other similar hardware, they may be programmed and controlled using software (for example, microcode) to perform various functions discussed herein and may optionally be driven by firmware and/or software.

It is also contemplated that each block, unit, and/or module may be implemented by dedicated hardware, or as a combination of dedicated hardware to perform some functions and a processor (for example, one or more programmed microprocessors and associated circuitry) to perform other functions.

Each block, unit, and/or module of embodiments may be physically separated into two or more interacting and discrete blocks, units, and/or modules without departing from the scope of the disclosure.

Further, the blocks, units, and/or modules of embodiments may be physically combined into more complex blocks, units, and/or modules without departing from the scope of the disclosure.

In addition, an expression "is the same" in the description may mean "is substantially the same". For example, the expression "is the same" may be the same enough for those of ordinary skill to understand that it is the same. Other expressions may also be expressions in which "substantially" may be omitted.

FIG. 1 is a diagram illustrating an embodiment of a display device.

Referring to FIG. 1, the display device 100 may include a display panel 110, a gate driver 120, a data driver 130, a voltage generator 140, and a controller 150.

The display panel 110 may include sub-pixels SP. The sub-pixels SP may be connected to the gate driver 120 through first to m-th gate lines GL1 to GLm. The sub-pixels SP may be connected to the data driver 130 through first to n-th data lines DL1 to DLn.

Each of the sub-pixels SP may include at least one light emitting element formed to generate light. Accordingly, each of the sub-pixels SP may generate light of a given color such as red, green, blue, cyan, magenta, or yellow. Two or more sub-pixels among the sub-pixels SP may form one pixel PXL. For example, as shown in FIG. 1, three sub-pixels may form one pixel PXL.

The gate driver 120 is connected to the sub-pixels SP arranged or disposed in a row direction through the first to m-th gate lines GL1 to GLm. The gate driver 120 may output gate signals to the first to m-th gate lines GL1 to GLm in response to a gate control signal GCS. In embodiments, the gate control signal GCS may include a start signal indicating a start of each frame, a horizontal synchronization signal for outputting the gate signals in synchronization with a timing at which data signals are applied, and the like within the spirit and the scope of the disclosure.

The gate driver 120 may be disposed on one side or a side of the display panel 110. However, embodiments are not limited thereto. For example, the gate driver 120 may be divided into two or more physically and/or logically divided drivers, and such drivers may be disposed on one side or a side of the display panel 110 and another side of the display panel 110 opposite the one side or a side. As described above, the gate driver 120 may be disposed around the display panel 110 in various shapes according to embodiments.

The data driver 130 is connected to the sub-pixels SP arranged or disposed in a column direction through the first to n-th data lines DL1 to DLn. The data driver 130 receives image data DATA and a data control signal DCS from the controller 150. The data driver 130 operates in response to the data control signal DCS. In embodiments, the data control signal DCS may include a source start pulse, a source shift clock, a source output enable signal, and the like within the spirit and the scope of the disclosure.

The data driver 130 may apply data signals having grayscale voltages corresponding to the image data DATA to the first to n-th data lines DL1 to DLn using voltages from the voltage generator 140. In case that the gate signal is applied to each of the first to m-th gate lines GL1 to GLm, the data signals corresponding to the image data DATA may be applied to the data lines DL1 to DLm. Accordingly, the corresponding sub-pixels SP may generate light corresponding to the data signals. Accordingly, an image is displayed on the display panel 110.

In embodiments, the gate driver 120 and the data driver 130 may include complementary metal-oxide semiconductor (CMOS) circuit elements.

The voltage generator 140 may operate in response to a voltage control signal VCS from the controller 150. The voltage generator 140 is formed to generate voltages and provide the generated voltages to components of the display device 100. For example, the voltage generator 140 may be formed to generate the voltages by receiving an input voltage from an outside of the display device 100, adjusting the received voltage, and regulating the adjusted voltage.

The voltage generator 140 may generate a first power voltage VDD and a second power voltage VSS, and the generated first and second power voltages VDD and VSS may be provided to the sub-pixels SP. The first power voltage VDD may have a relatively high voltage level, and the second power voltage VSS may have a voltage level lower than that of the first power voltage VDD. In other embodiments, the first power voltage VDD or the second power voltage VSS may be provided by an external device of the display device 100.

The voltage generator 140 may generate various voltages. For example, the voltage generator 140 may generate an initialization voltage applied to the sub-pixels SP. For example, during a sensing operation for sensing electrical characteristics of transistors and/or light emitting elements of the sub-pixels SP, a selectable reference voltage may be applied to the first to n-th data lines DL1 to DLn, and the voltage generator 140 may generate such a reference voltage.

The controller 150 controls overall operations of the display device 100. The controller 150 receives input image data IMG and a control signal CTRL for controlling display of the input image data IMG from the outside. The controller 150 may provide the gate control signal GCS, the data control signal DCS, and the voltage control signal VCS in response to the control signal CTRL.

The controller 150 may convert the input image data IMG so that the input image data IMG is suitable for the display device 100 or the display panel 110 and output the image data DATA. In embodiments, the controller 150 may output the image data DATA by aligning the input image data IMG so that the input image data IMG is suitable for a disposition of the sub-pixels SP.

Two or more components of the data driver 130, the voltage generator 140, and the controller 150 may be mounted on one integrated circuit. As shown in FIG. 1, the data driver 130, the voltage generator 140, and the controller 150 may be included in a driver integrated circuit DIC. In this case, the data driver 130, the voltage generator 140, and the controller 150 may be functionally divided components in one driver integrated circuit DIC. In other embodiments, at least one of the data driver 130, the voltage generator 140, and the controller 150 may be provided as a component distinguished from the driver integrated circuit DIC.

According to an embodiment, the display device 100 may include at least one temperature sensor 160. The temperature sensor 160 is formed to sense a temperature around the temperature sensor 160 and generate temperature data TEP indicating the sensed temperature. In embodiments, the temperature sensor 160 may be disposed adjacent to the display panel 110 and/or the driver integrated circuit DIC.

The controller 150 may control various operations of the display device 100 in response to the temperature data TEP. In embodiments, the controller 150 may adjust a luminance of the image output from the display panel 110 in response to the temperature data TEP. For example, the controller 150 may control the data signals and the first and second power voltages VDD and VSS by controlling components such as the data driver 130 and/or the voltage generator 140.

Figure 2:
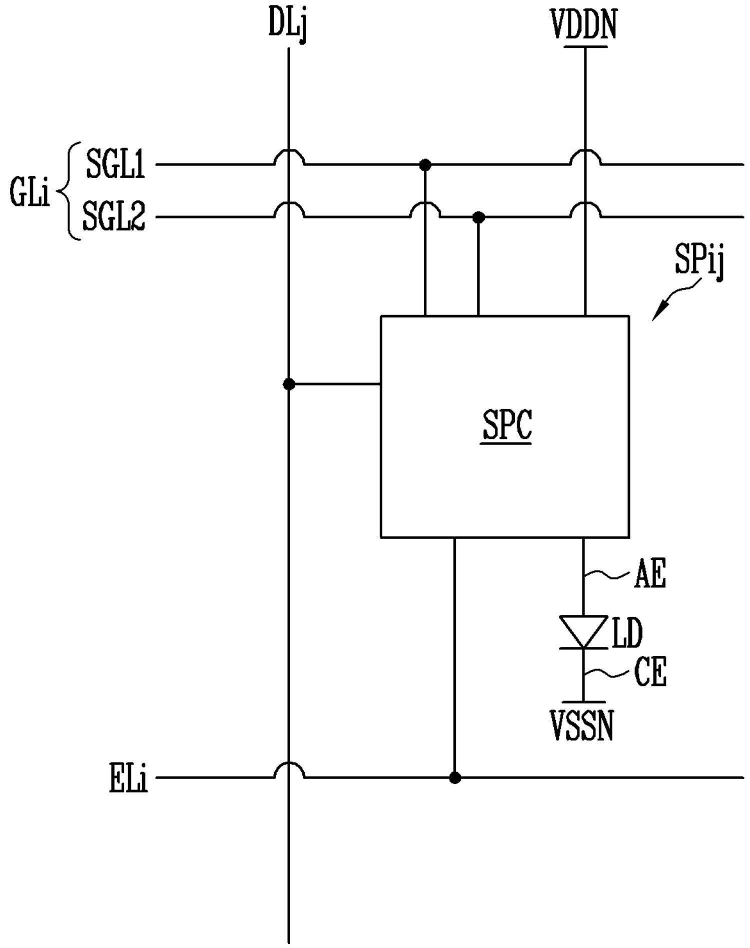
FIG. 2 is a block diagram illustrating an embodiment of any one of sub-pixels of FIG. 1.

FIG. 2 is a block diagram illustrating an example of any one of the sub-pixels of FIG. 1. In FIG. 2, among the sub-pixels SP of FIG. 1, a sub-pixel SPij arranged or disposed in an i-th row (i is an integer greater than or equal to 1 and less than or equal to m) and a j-th column (j is an integer greater than or equal to 1 and less than or equal to n) is shown as an example.

Referring to FIG. 2, the sub-pixel SPij may include a sub-pixel circuit SPC and a light emitting element LD.

The light emitting element LD is connected between a first power voltage node VDDN and a second power voltage node VSSN. At this time, the first power voltage node VDDN is a node that transfers the first power voltage VDD of FIG. 1, and the second power voltage node VSSN is a node that transfers the second power voltage VSS of FIG. 1.

An anode electrode AE of the light emitting element LD may be connected to the first power voltage node VDDN through the sub-pixel circuit SPC, and a cathode electrode CE of the light emitting element LD may be connected to the second power voltage node VSSN. For example, the anode electrode AE of the light emitting element LD may be connected to the first power voltage node VDDN through one or more transistors included in the sub-pixel circuit SPC.

The sub-pixel circuit SPC may be connected to an i-th gate line GLi among the first to m-th gate lines GL1 to GLm of FIG. 1, an i-th emission control line ELi among the first to m-th emission control lines ELi to ELm of FIG. 1, and a j-th data line DLj among the first to n-th data lines DL1 to DLn of FIG. 1. The sub-pixel circuit SPC is formed to control the light emitting element LD according to signals received through such signal lines.

The sub-pixel circuit SPC may operate in response to a gate signal received through the i-th gate line GLi. The i-th gate line GLi may include one or more sub-gate lines. In embodiments, as shown in FIG. 2, the i-th gate line GLi may include first and second sub-gate lines SGL1 and SGL2. The sub-pixel circuit SPC may operate in response to gate signals received through the first and second sub-gate lines SGL1 and SGL2. As described above, in case that the i-th gate line GLi may include two or more sub-gate lines, the sub-pixel circuit SPC may operate in response to gate signals received through the corresponding sub-gate lines.

The sub-pixel circuit SPC may operate in response to an emission control signal received through the i-th emission control line ELi. In embodiments, the i-th emission control line ELi may include one or more sub-emission control lines. In case that the i-th emission control line ELi may include two or more sub-emission control lines, the sub-pixel circuit SPC may operate in response to emission control signals received through the corresponding sub-emission control lines.

The sub-pixel circuit SPC may receive a data signal through the j-th data line DLj. The sub-pixel circuit SPC may store a voltage corresponding to the data signal in response to at least one of the gate signals received through the first and second sub-gate lines SGL1 and SGL2. The sub-pixel circuit SPC may adjust a current flowing from the first power voltage node VDDN to the second power voltage node VSSN through the light emitting element LD according to the stored voltage, in response the emission control signal received through the i-th emission control line ELi. Accordingly, the light emitting element LD may generate light of a luminance corresponding to the data signal.

Figure 3:
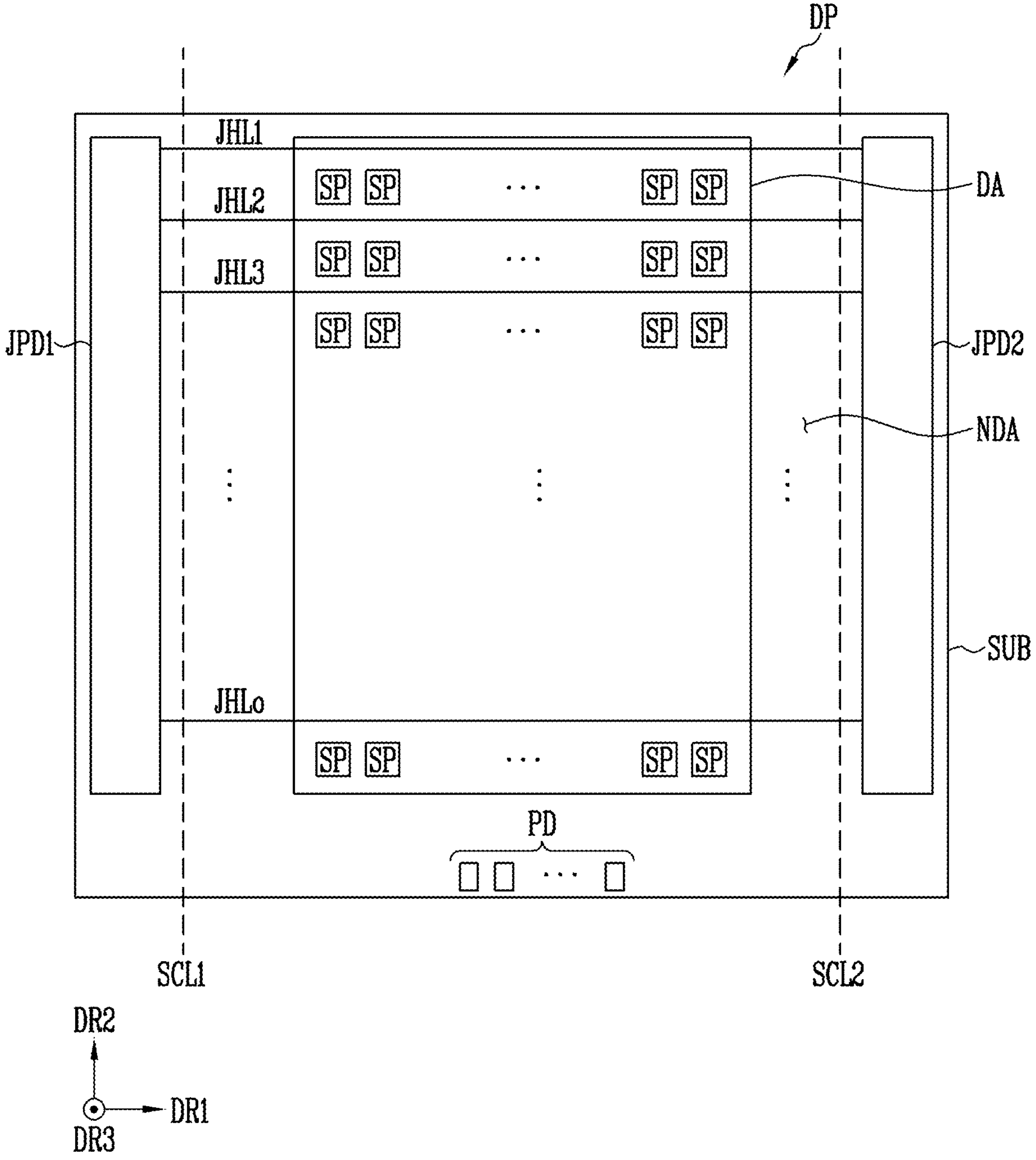
FIG. 3 is a schematic plan view illustrating an embodiment of a display panel of FIG. 1.

FIG. 3 is a schematic plan view illustrating an embodiment of the display panel of FIG. 1.

Referring to FIG. 3, an embodiment DP of the display panel 110 of FIG. 1 may include a display area DA and a non-display area NDA. The display panel DP displays an image through the display area DA. The non-display area NDA is disposed around the display area DA.

The display panel DP may include a substrate SUB, the sub-pixels SP, a first metal pad JPD1, a second metal pad JPD2, metal lines JHL1 to JHLo, and pads PD.

In case that the display panel DP is used as a display screen of a head mounted display (HMD), a virtual reality (VR) device, a mixed reality (MR) device, an augmented reality (AR) device, or the like, the display panel DP may be positioned very close to user's eyes. In this case, sub-pixels SP of a relatively high integration degree are required. In order to increase an integration degree of the sub-pixels SP, the substrate SUB may be provided as a silicon substrate. The sub-pixels SP and/or the display panel DP may be formed on the substrate SUB, which is the silicon substrate. The display device 100 (refer to FIG. 1) including the display panel DP formed on the substrate SUB, which is the silicon substrate, may be referred to as an OLED on silicon (OLEDoS) display device.

The sub-pixels SP are positioned in the display area DA on the substrate SUB. The sub-pixels SP may be arranged or disposed in a matrix shape along a first direction DR1 and a second direction DR2 crossing or intersecting the first direction DR1. However, embodiments are not limited thereto. For example, the sub-pixels SP may be arranged or disposed in a zigzag shape along the first direction DR1 and the second direction DR2. For example, the sub-pixels SP may be arranged or disposed in a PENTILE™ shape. The first direction DR1 may be a row direction, and the second direction DR2 may be a column direction. Two or more sub-pixels among the sub-pixels SP may form one pixel PXL.

The substrate SUB may include the display area DA and the non-display area NDA. A component for controlling the sub-pixels SP may be disposed in the non-display area NDA on the substrate SUB. For example, lines connected to the sub-pixels SP, such as the first to m-th gate lines GL1 to GLm and the first to n-th data lines DL1 to DLn of FIG. 1, may be disposed in the non-display area NDA, in space-efficiently.

The first metal pad JPD1 may be positioned in the non-display area NDA. The first metal pad JPD1 may have a substantially rectangular shape in which a long side extends in the second direction DR2 and a short side extends in the first direction DR1. A length of the long side may be similar to a length of the second direction DR2 of the display area DA. The first metal pad JPD1 may include at least one metal material. For example, the first metal pad JPD1 may include a material with high resistivity or high melting point, such as molybdenum (Mo), titanium (Ti), or titanium nitride (TiN). The first metal pad JPD1 may be positioned in a direction opposite to the first direction DR1 from the display area DA. In embodiments, a voltage may be applied to the metal lines JHL1 to JHLo through the first metal pad JPD1.

The second metal pad JPD2 may be positioned in the non-display area NDA and may be positioned in the first direction DR1 from the first metal pad JPD1. The second metal pad JPD2 may have a substantially rectangular shape in which a long side extends in the second direction DR2 and a short side extends in the first direction DR1. A length of the long side may be similar to the length of the second direction DR2 of the display area DA. The second metal pad JPD2 may include at least one metal material. For example, the second metal pad JPD2 may include a material with high resistivity or high melting point, such as molybdenum (Mo), titanium (Ti), or titanium nitride (TiN). The second metal pad JPD2 may be positioned in the first direction DR1 from the display area DA. For example, the display area DA may be positioned between the first metal pad JPD1 and the second metal pad JPD2.

The metal lines JHL1 to JHLo may cross the non-display area NDA and the display area DA and may extend so as not to overlap emission areas of the sub-pixels SP in the display area DA. For example, the metal lines JHL1 to JHLo may extend to be spaced apart from the emission areas of the sub-pixels SP on a plane in the display area DA. o may be an integer greater than 1.

The metal lines JHL1 to JHLo may connect the first metal pad JPD1 and the second metal pad JPD2. The metal lines JHL1 to JHLo may be arranged or disposed parallel to each other in the second direction DR2. One ends of the metal lines JHL1 to JHLo may be connected to the first metal pad JPD1, and other ends of the metal lines JHL1 to JHLo may be connected to the second metal pad JPD2. For example, the metal lines JHL1 to JHLo may include a material with high resistivity or high melting point, such as molybdenum (Mo), titanium (Ti), and titanium nitride (TiN).

The first metal pad JPD1, the second metal pad JPD2, and the metal lines JHL1 to JHLo may be formed integrally with the same material and process.

In case that a power voltage is applied to the first metal pad JPD1, heat generation due to Joule heating may occur in the metal lines JHL1 to JHLo. The power voltage may be a single pulse or may include pulses. Due to the heat generation, an organic material adjacent to the metal lines JHL1 to JHLo may be sublimated. Therefore, during an operation of the display device 100, generation of a leakage current through the organic material may be prevented. In embodiments, the display device 100 may separately include a voltage generator (not shown) that applies the power voltage to the first metal pad JPD1.

In order to reach a temperature at which the organic material adjacent to the metal lines JHL1 to JHLo is sublimated, the voltage applied to the first metal pad JPD1 may require a high voltage level. However, in case that the voltage having the high voltage level is applied to the first metal pad JPD1, damage may occur in the sub-pixels SP adjacent to the metal lines JHL1 to JHLo.

Accordingly, a method of reaching the temperature at which the organic material adjacent to the metal lines JHL1 to JHLo is sublimated without damaging the sub-pixels SP adjacent to the metal lines JHL1 to JHLo may be required. A more detailed description of this is provided together with FIGS. 9 and 10.

A virtual first cutting line SCL1 may extend in the second direction DR2 between the first metal pad JPD1 and the display area DA. The first cutting line SCL1 may cross the metal lines JHL1 to JHLo. A second virtual cutting line SCL2 may extend in the second direction DR2 between the second metal pad JPD2 and the display area DA. The second cutting line SCL2 may cross the metal lines JHL1 to JHLo.

After a Joule heating process, as the display panel DP is cut along the cutting lines SCL1 and SCL2, the first metal pad JPD1 and the second metal pad JPD2 may not exist in a final product. In an embodiment, by not cutting the display panel DP along the cutting lines SCL1 and SCL2, the first metal pad JPD1 and the second metal pad JPD2 may exist in the final product.

At least one of the gate driver 120, the data driver 130, the voltage generator 140, the controller 150, and the temperature sensor 160 of FIG. 1 may be integrated in the non-display area NDA of the display panel DP. In embodiments, the gate driver 120 of FIG. 1 may be mounted on the display panel DP and may be disposed in the non-display area NDA. In other embodiments, the gate driver 120 may be implemented as an integrated circuit separated from the display panel DP. In embodiments, the temperature sensor 160 may be disposed in the non-display area NDA to sense a temperature of the display panel DP.

The pads PD are disposed in the non-display area NDA on the substrate SUB. At least a portion of the pads PD may be electrically connected to the sub-pixels SP through lines. For example, a portion of the pads PD may be connected to the sub-pixels SP through the first to n-th data lines DL1 to DLn.

The pads PD may interface the display panel DP to other components of the display device 100 (refer to FIG. 1). In embodiments, voltages and signals desirable for an operation of components included in the display panel DP may be provided from the driver integrated circuit DIC of FIG. 1 through the pads PD. For example, the first to n-th data lines DL1 to DLn may be connected to the driver integrated circuit DIC through the pads PD. For example, the first and second power voltages VDD and VSS may be received from the driver integrated circuit DIC through the pads PD. For example, in case that the gate driver 120 is mounted on the display panel DP, the gate control signal GCS may be transmitted from the driver integrated circuit DIC to the gate driver 120 through the pads PD.

In embodiments, a circuit board may be electrically connected to the pads PD using a conductive adhesive member such as an anisotropic conductive film. At this time, the circuit board may be a flexible circuit board (FPCB) or a flexible film having a flexible material. The driver integrated circuit DIC may be mounted on the circuit board to be electrically connected to the pads PD.

In embodiments, the display area DA may have various shapes. The display area DA may have a closed loop shape including straight and/or curved sides. For example, the display area DA may have shapes such as a polygon, a circle, a semicircle, and an ellipse.

In embodiments, the display panel DP may have a flat display surface. In other embodiments, the display panel DP may have a display surface that is at least partially round. In embodiments, the display panel DP may be bendable, foldable, or rollable. In these cases, the display panel DP and/or the substrate SUB may include materials having a flexible property.

Figure 4:
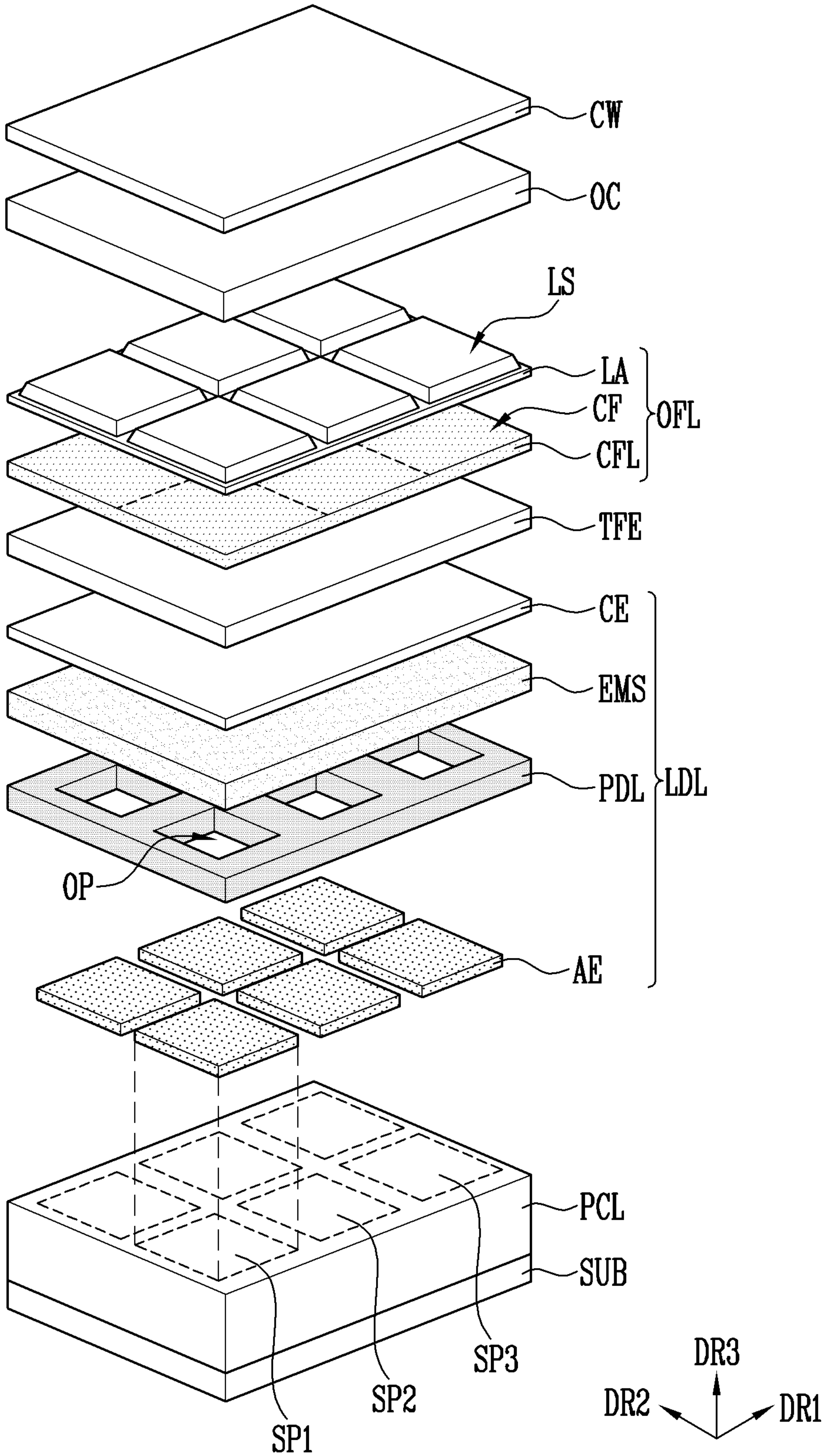
FIG. 4 is an exploded perspective view illustrating a portion of the display panel of FIG. 3.

FIG. 4 is an exploded perspective view illustrating a portion of the display panel of FIG. 3.

Referring to FIG. 4, the display panel DP may include the substrate SUB, a pixel circuit layer PCL, a light emitting element layer LDL, an encapsulation layer TFE, an optical functional layer OFL, an overcoat layer OC, and a cover window CW.

In embodiments, the substrate SUB may include a silicon wafer substrate formed using a semiconductor process. The substrate SUB may include a semiconductor material suitable for forming circuit elements. For example, the semiconductor material may include silicon, germanium, and/or silicon-germanium. The substrate SUB may be provided from a bulk wafer, an epitaxial layer, a silicon on insulator (SOI) layer, a semiconductor on insulator (SeOI) layer, or the like within the spirit and the scope of the disclosure. In other embodiments, the substrate SUB may include a glass substrate. In other embodiments, the substrate SUB may include a polyimide (PI) substrate.

The pixel circuit layer PCL is disposed on the substrate SUB. The substrate SUB and/or the pixel circuit layer PCL may include insulating layers and conductive patterns disposed between the insulating layers. The conductive patterns of the pixel circuit layer PCL may function as at least a portion of circuit elements, lines, and the like within the spirit and the scope of the disclosure. The conductive patterns may include copper, but embodiments are not limited thereto.

The circuit elements may include a sub-pixel circuit of each of first to third sub-pixels SP1, SP2, and SP3. The sub-pixel circuit SPC may include transistors and at least one capacitor. Each transistor may include a semiconductor portion including a source area, a drain area, and a channel area, and a gate electrode overlapping the semiconductor portion. In embodiments, in case that the substrate SUB is provided as a silicon substrate, the semiconductor portion may be included in the substrate SUB, and the gate electrode may be included in the pixel circuit layer PCL as a conductive pattern of the pixel circuit layer PCL. In embodiments, in case that the substrate SUB is provided as a glass substrate or a PI substrate, the semiconductor portion and the gate electrode may be included in the pixel circuit layer PCL. Each capacitor may include electrodes spaced apart from each other. For example, each capacitor may include electrodes spaced apart from each other on a plane defined by the first and second directions DR1 and DR2. For example, each capacitor may include electrodes spaced apart from each other in a third direction DR3 with an insulating layer disposed between the electrodes.

The lines of the pixel circuit layer PCL may include signal lines connected to each of the sub-pixels, for example, a gate line, an emission control line, a data line, and the like within the spirit and the scope of the disclosure. The lines may further include a line connected to the first power voltage node VDDN of FIG. 2. The lines may further include a line connected to the second power voltage node VSSN of FIG. 2.

The light emitting element layer LDL may include the anode electrodes AE, a pixel defining layer PDL, a light emitting structure EMS, and the cathode electrode CE.

The anode electrodes AE may be disposed on the pixel circuit layer PCL. The anode electrodes AE may contact the circuit elements of the pixel circuit layer PCL. The anode electrodes AE may include an opaque conductive material capable of reflecting light, but embodiments are not limited thereto.

The pixel defining layer PDL is disposed on the anode electrodes AE. The pixel defining layer PDL may include an opening OP exposing a portion of each of the anode electrodes AE. The opening OP of the pixel defining layer PDL may be understood as emission areas corresponding to the first to third sub-pixels SP1 to SP3, respectively.

In embodiments, the pixel defining layer PDL may include an inorganic material. In this case, the pixel defining layer PDL may include stacked inorganic layers. For example, the pixel defining layer PDL may include silicon oxide $SiO_x$ and silicon nitride $SiN_x$. In other embodiments, the pixel defining layer PDL may include an organic material. However, a material of the pixel defining layer PDL is not limited thereto.

The light emitting structure EMS may be disposed on the anode electrodes AE exposed by the opening OP of the pixel defining layer PDL. The light emitting structure EMS may include a light emitting layer formed to generate light, an electron transport layer formed to transport an electron, a hole transport layer formed to transport a hole, and the like within the spirit and the scope of the disclosure.

In embodiments, the light emitting structure EMS may fill the opening OP of the pixel defining layer PDL, and may be entirely disposed on the pixel defining layer PDL. In other words, the light emitting structure EMS may extend across the first to third sub-pixels SP1 to SP3. In this case, at least a portion of layers in the light emitting structure EMS may be disconnected, bent, or removed at boundaries between the sub-pixels. However, embodiments are not limited thereto. For example, portions of the light emitting structure EMS corresponding to the sub-pixels may be separated from each other, and each of the portions may be disposed in the opening OP of the pixel defining layer PDL.

The cathode electrode CE may be disposed on the light emitting structure EMS. The cathode electrode CE may extend across the sub-pixels. As described above, the cathode electrode CE may be provided as a common electrode for the sub-pixels.

The cathode electrode CE may be a thin metal layer having a thickness sufficient to transmit light emitted from the light emitting structure EMS. The cathode electrode CE may be formed of a metal material or a transparent conductive material to have a relatively thin thickness. In embodiments, the cathode electrode CE may include at least one of various transparent conductive materials including indium tin oxide, indium zinc oxide, indium tin zinc oxide, aluminum zinc oxide, gallium zinc oxide, zinc tin oxide, or gallium tin oxide. In other embodiments, the cathode electrode CE may include at least one of silver (Ag), magnesium (Mg), and a mixture thereof. However, a material of the cathode electrode CE is not limited thereto.

It may be understood that any one of the anode electrodes AE, a portion of the light emitting structure EMS overlapping it, and a portion of the cathode electrode CE overlapping it form one light emitting element LD (refer to FIG. 2). In other words, each of the light emitting elements of the sub-pixels may be one anode electrode, a portion of the light emitting structure EMS overlapping it, and a portion of the cathode electrode CE overlapping it. In each of the first to third sub-pixels SP1 to SP3, holes injected from the anode electrode AE and electrons injected from the cathode electrode CE may be transported into the light emitting layer of the light emitting structure EMS to form excitons, and in case that the excitons transits from an excited state to a ground state, light may be generated. A luminance of light may be determined according to an amount of a current flowing through the light emitting layer. According to a configuration of the light emitting layer, a wavelength range of the generated light may be determined.

The encapsulation layer TFE is disposed on the cathode electrode CE. The encapsulation layer TFE may cover the light emitting element layer LDL and/or the pixel circuit layer PCL. The encapsulation layer TFE may be formed to prevent oxygen, moisture, and/or the like from permeating to the light emitting element layer LDL. In embodiments, the encapsulation layer TFE may include a structure in which one or more inorganic layers and one or more organic layers may be alternately stacked each other. For example, the inorganic layer may include silicon nitride, silicon oxide, silicon oxynitride ($SiO_xN_y$), or the like within the spirit and the scope of the disclosure. For example, the organic layer may include an organic insulating material such as polyacrylates resin, epoxy resin, phenolic resin, polyamides resin, polyimides resin, unsaturated polyesters resin, poly phenylenethers resin, polyphenylenesulfides resin, or benzocyclobutene (BCB). However, materials of the organic layer and the inorganic layer of the encapsulation layer TFE are not limited thereto.

In order to improve an encapsulation efficiency of the encapsulation layer TFE, the encapsulation layer TFE may further include a thin film including aluminum oxide (AlOx). The thin film including the aluminum oxide may be positioned on an upper surface of the encapsulation layer TFE facing the optical functional layer OFL and/or a lower surface of the encapsulating layer TFE facing the light emitting element layer LDL.

The thin film including the aluminum oxide may be formed through atomic layer deposition (ALD) method. However, embodiments are not limited thereto. The encapsulation layer TFE may further include a thin film formed of at least one of various materials suitable for improving the encapsulation efficiency.

The optical functional layer OFL is disposed on the encapsulation layer TFE. The optical functional layer OFL may include a color filter layer CFL and a lens array LA.

The color filter layer CFL is disposed between the encapsulation layer TFE and the lens array LA. The color filter layer CFL is formed to filter the light emitted from the light emitting structure EMS and selectively output light of a wavelength range or a color corresponding to each sub-pixel. The color filter layer CFL may include color filters CF respectively corresponding to the sub-pixels, and each of the color filters CF may pass light of a wavelength range corresponding to the corresponding sub-pixel. For example, the color filter corresponding to the first sub-pixel SP1 may pass red color light, the color filter corresponding to the second sub-pixel SP2 may pass green color light, and the color filter corresponding to the third sub-pixel SP3 may pass blue color light. According to the light emitted from the light emitting structure EMS of each sub-pixel, at least a portion of the color filters CF may be omitted.

The lens array LA is disposed on the color filter layer CFL. The lens array LA may include lenses LS respectively corresponding to the sub-pixels. Each of the lenses LS may improve light output efficiency by outputting the light emitted from the light emitting structure EMS to an intended path. The lens array LA may have a relatively high refractive index. For example, the lens array LA may have a refractive index higher than that of the overcoat layer OC. In embodiments, the lenses LS may include an organic material. In embodiments, the lenses LS may include an acrylate material. However, a material of the lenses LS is not limited thereto.

In embodiments, compared to the opening OP of the pixel defining layer PDL, at least a portion of the color filters CF of the color filter layer CFL and at least a portion of the lenses LS of the lens array LA may be shifted in a direction parallel to the plane defined by the first and second directions DR1 and DR2. By way of example, in a central area of the display area DA, a center of the color filter and a center of the lens may be aligned with or overlap a center of the opening OP of the corresponding pixel definition layer PDL when viewed in the third direction DR3. For example, in the central area of the display area DA, the opening OP of the pixel defining layer PDL may completely overlap the corresponding color filter of the color filter layer CFL and the corresponding lens of the lens array LA. In an area adjacent to the non-display area NDA in the display area DA, the center of the color filter and the center of the lens may be shifted in a plane direction from the center of the opening OP of the corresponding pixel defining layer PDL when viewed in the third direction DR3. For example, in the area adjacent to the non-display area NDA in the display area DA, the opening OP of the pixel defining layer PDL may be partially overlap of the corresponding color filter of the color filter layer CFL and the corresponding lens of the lens array LA. Accordingly, at a center of the display area DA, the light emitted from the light emitting structure EMS may be efficiently output in a normal direction of a display surface. At an outskirt of the display area DA, the light emitted from the light emitting structure EMS may be efficiently output in a direction inclined by a selectable angle with respect to the normal direction of the display surface.

The overcoat layer OC may be disposed on the lens array LA. The overcoat layer OC may cover the optical functional layer OFL, the encapsulation layer TFE, the light emitting structure EMS, and/or the pixel circuit layer PCL. The overcoat layer OC may include various materials suitable for protecting layers thereunder from a foreign substance such as dust or moisture. For example, the overcoat layer OC may include at least one of an inorganic insulating layer and an organic insulating layer. For example, the overcoat layer OC may include epoxy, but embodiments are not limited thereto. The overcoat layer OC may have a refractive index lower than that of the lens array LA.

The cover window CW may be disposed on the overcoat layer OC. The cover window CW is formed to protect layers thereunder. The cover window CW may have a refractive index higher than that of the overcoat layer OC. The cover window CW may include glass, but embodiments are not limited thereto. For example, the cover window CW may be an encapsulation glass formed to protect components disposed thereunder. In other embodiments, the cover window CW may be omitted.

Figure 5:
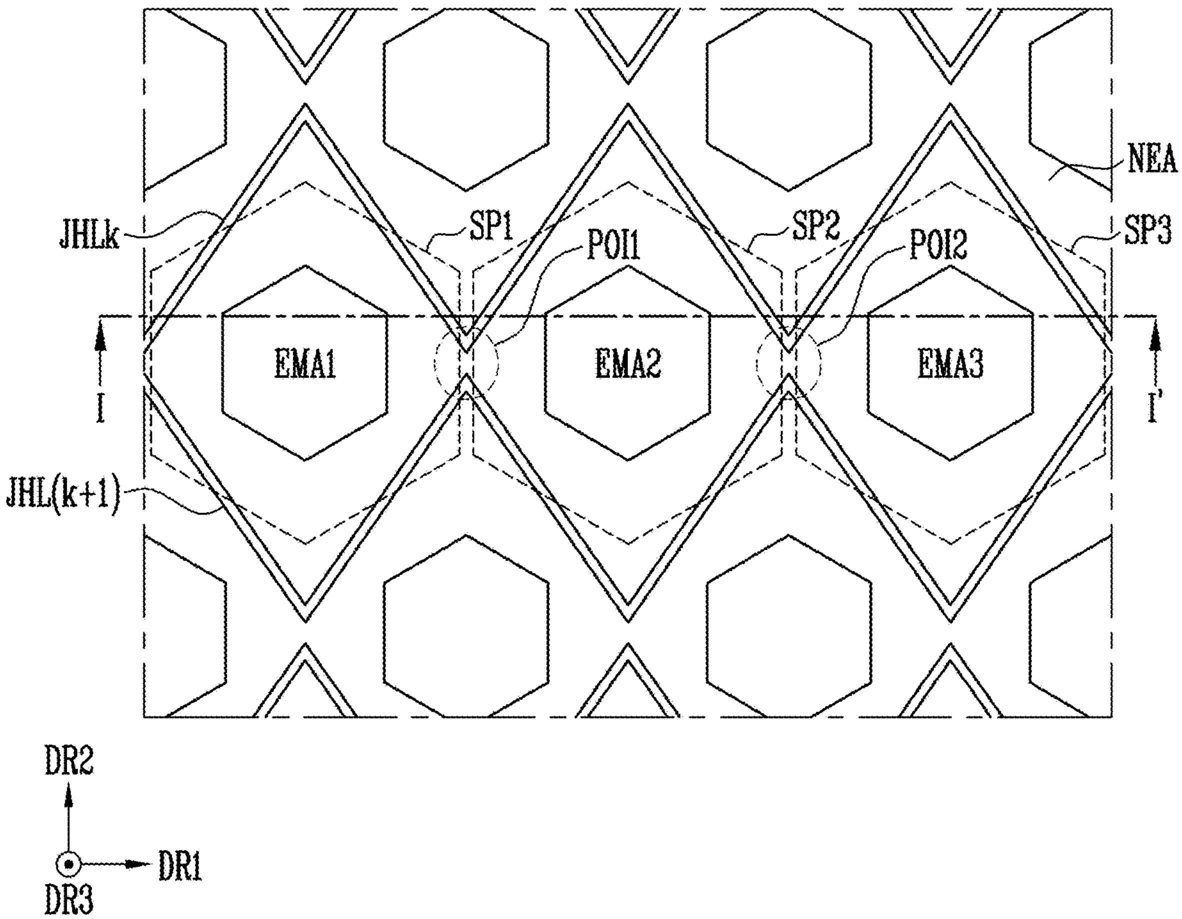
FIG. 5 is a schematic plan view illustrating a relationship of sub-pixels and metal lines.

FIG. 5 is a schematic plan view illustrating a relationship of the sub-pixels and the metal lines.

Referring to FIG. 5, the first to third sub-pixels SP1, SP2, and SP3 arranged or disposed in the first direction DR1 are illustrated. The first sub-pixel SP1 may include a first emission area EMA1 and a non-emission area NEA around the first emission area EMAL. The second sub-pixel SP2 may include a second emission area EMA2 and a non-emission area NEA around the second emission area EMA2.

The third sub-pixel SP3 may include a third emission area EMA3 and a non-emission area NEA around the third emission area EMA3.

The first emission area EMA1 may be an area where light is emitted from a portion of the light emitting structure EMS (refer to FIG. 4) corresponding to the first sub-pixel SP1. The second emission area EMA2 may be an area where light is emitted from a portion of the light emitting structure EMS corresponding to the second sub-pixel SP2. The third emission area EMA3 may be an area where light is emitted from a portion of the light emitting structure EMS corresponding to the third sub-pixel SP3. As described with reference to FIG. 5, each emission area may be understood as the opening OP of the pixel defining layer PDL corresponding to each of the first to third sub-pixels SP1 to SP3.

In FIG. 5, the emission areas EMA1, EMA2, and EMA3 are illustrated as a hexagon, but the emission areas EMA1, EMA2, and EMA3 may also be formed as another polygon including a quadrangle. The emission areas EMA1, EMA2, and EMA3 may be formed as a circular shape or an elliptical shape. Shapes and areas of the different emission areas EMA1, EMA2, and EMA3 may be different.

Metal lines JHLk and JHL(k+1) may extend in the first direction DR1 and have a shape surrounding the corresponding emission areas EMA1, EMA2, and EMA3. For example, the metal lines JHLk and JHL(k+1) may extend in the first direction DR1 in a zigzag shape.

However, since the metal lines JHLk and JHL(k+1) are not connected to each other on the display area DA, areas POI1 and POI2 that are not covered by the metal lines JHLk and JHL(k+1) may exist between the adjacent emission areas EMA1, EMA2, and EMA3. However, in the areas POI1 and POI2, two or more metal lines JHLk and JHL(k+1) may be disposed adjacent to each other with a minimum distance. According to the embodiment, since an organic material existing in the areas POI1 and POI2 that do not overlap the metal lines JHLk and JHL(k+1) may also be sublimated due to heat generated from the two adjacent metal lines JHLk and JHL(k+1), a leakage current through the organic material may be prevented.

Figure 6:
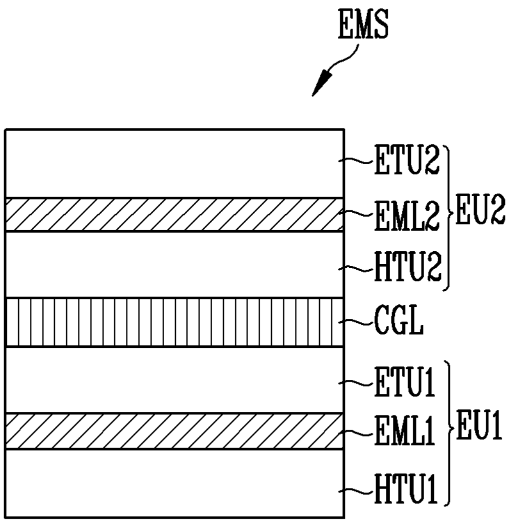
FIG. 6 is a schematic cross-sectional view illustrating an embodiment of a light emitting structure.

FIG. 6 is a schematic cross-sectional view illustrating an embodiment of a light emitting structure.

Referring to FIG. 6, the light emitting structure EMS may have a tandem structure in which first and second light emitting units EU1 and EU2 may be stacked each other.

Each of the first and second light emitting units EU1 and EU2 may include a light emitting layer that generates light according to an applied current. The first light emitting unit EU1 may include a first light emitting layer EML1, a first electron transport unit ETU1, and a first hole transport unit HTU1. The first light emitting layer EML1 may be disposed between the first electron transport unit ETU1 and the first hole transport unit HTU1. The second light emitting unit EU2 may include a second light emitting layer EML2, a second electron transport unit ETU2, and a second hole transport unit HTU2. The second light emitting layer EML2 may be disposed between the second electron transport unit ETU2 and the second hole transport unit HTU2.

Each of the first and second hole transport units HTU1 and HTU2 may include at least one of a hole injection layer and a hole transport layer, and may further include a hole buffer layer, an electron blocking layer, and the like if desirable. The first and second hole transport units HTU1 and HTU2 may have configurations equal to each other or different from each other.

Each of the first and second electron transport units ETU1 and ETU2 may include at least one of an electron injection layer and an electron transport layer, and may further include an electron buffer layer, a hole blocking layer, and the like if desirable. The first and second electron transport units ETU1 and ETU2 may have configurations equal to each other or different from each other.

A connection layer, which may be provided in a form of a charge generation layer CGL, may be disposed between the first light emitting unit EU1 and the second light emitting unit EU2 to connect the first light emitting unit EU1 and the second light emitting unit EU2 to each other. In embodiments, the charge generation layer CGL may have a stack structure of a p dopant layer and an n dopant layer. For example, the p dopant layer may include a p-type dopant such as HAT-CN, TCNQ, and NDP-9, and the n dopant layer may include an alkali metal, an alkaline earth metal, a lanthanide metal, or a combination thereof. However, embodiments are not limited thereto.

In embodiments, the first light emitting layer EML1 and the second light emitting layer EML2 may generate light of different colors. Light emitted from each of the first light emitting layer EML1 and the second light emitting layer EML2 may be mixed and viewed as white light. For example, the first light emitting layer EML1 may generate light of a blue color, and the second light emitting layer EML2 may generate light of a yellow color. In embodiments, the second light emitting layer EML2 may include a structure in which a first sub light emitting layer formed to generate light of a red color and a second sub light emitting layer formed to generate light of a green color may be stacked each other. The light of the red color and the light of the green color may be mixed, and thus the light of the yellow color may be provided. In this case, an intermediate layer formed to perform a function of transporting holes and/or blocking transport of electrons may be further disposed between the first and second sub light emitting layers.

In other embodiments, the first light emitting layer EML1 and the second light emitting layer EML2 may generate light of the same color.

In embodiments, the light emitting structure EMS may be formed through a method of vacuum deposition, inkjet printing, or the like, but embodiments are not limited thereto.

Figure 7:
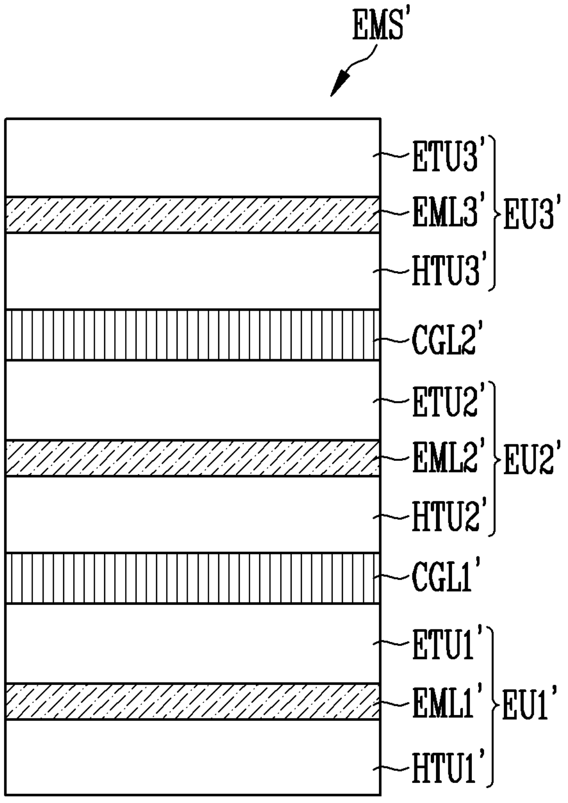
FIG. 7 is a schematic cross-sectional view illustrating an embodiment of a light emitting structure.

FIG. 7 is a schematic cross-sectional view illustrating an embodiment of a light emitting structure.

Referring to FIG. 7, the light emitting structure EMS' may have a tandem structure in which first to third light emitting units EU1' to EU3' may be stacked each other.

Each of the first to third light emitting units EU1' to EU3' may include a light emitting layer that generates light according to an applied current. The first light emitting unit EU1' may include a first light emitting layer EML1', a first electron transport unit ETU1', and a first hole transport unit HTU1'. The first light emitting layer EML1' may be disposed between the first electron transport unit ETU1' and the first hole transport unit HTU1'. The second light emitting unit EU2' may include a second light emitting layer EML2', a second electron transport unit ETU2', and a second hole transport unit HTU2'. The second light emitting layer EML2' may be disposed between the second electron transport unit ETU2' and the second hole transport unit HTU2'. The third light emitting unit EU3' may include a third light emitting layer EML3', a third electron transport unit ETU3', and a third hole transport unit HTU3'. The third light emitting layer EML3' may be disposed between the third electron transport unit ETU3' and the third hole transport unit HTU3'.

Each of the first to third hole transport units HTU1' to HTU3' may include at least one of a hole injection layer and a hole transport layer, and may further include a hole buffer layer, an electron blocking layer, and the like if desirable. The first to third hole transport units HTU1' to HTU3' may have configurations equal to each other or different from each other.

Each of the first to third electron transport units ETU1' to ETU3' may include at least one of an electron injection layer and an electron transport layer, and may further include an electron buffer layer, a hole blocking layer, and the like, if desirable. The first to third electron transport units ETU1' to ETU3' may have configurations equal to each other or different from each other.

A first charge generation layer CGL1' is disposed between the first light emitting unit EU1' and the second light emitting unit EU2'. A second charge generation layer CGL2' is disposed between the second light emitting unit EU2' and the third light emitting unit EU3'.

In embodiments, the first to third light emitting layers EML1' to EML3' may generate light of different colors. Light emitted from each of the first to third light emitting layers EML1' to EML3' may be mixed and may be viewed as white light. For example, the first emitting layer EML1' may generate light of a blue color, the second emitting layer EML2' may generate light of a green color, and the third emitting layer EML3' may generate light of a red color.

In other embodiments, two or more of the first to third light emitting layers EML1' to EML3' may generate light of the same color.

Different from that shown in FIGS. 6 and 7, each emitting structure EMS of each sub-pixel may include one light emitting unit. At this time, the light emitting units included in different sub-pixels SP1, SP2, and SP3 adjacent to each other may be formed to emit light of different colors. For example, the light emitting unit of the first sub-pixel SP1 may emit the light of the red color, the light emitting unit of the second sub-pixel SP2 may emit the light of the green light, and the light emitting unit of the third sub-pixel SP3 may emit the light of the blue color. In this case, the light emitting units of the first to third sub-pixels SP1 to SP3 may be separated from each other, and each of them may be disposed in the opening OP of the pixel defining layer PDL. In this case, at least a portion of the color filters CF1 to CF3 may be omitted.

Figure 8:
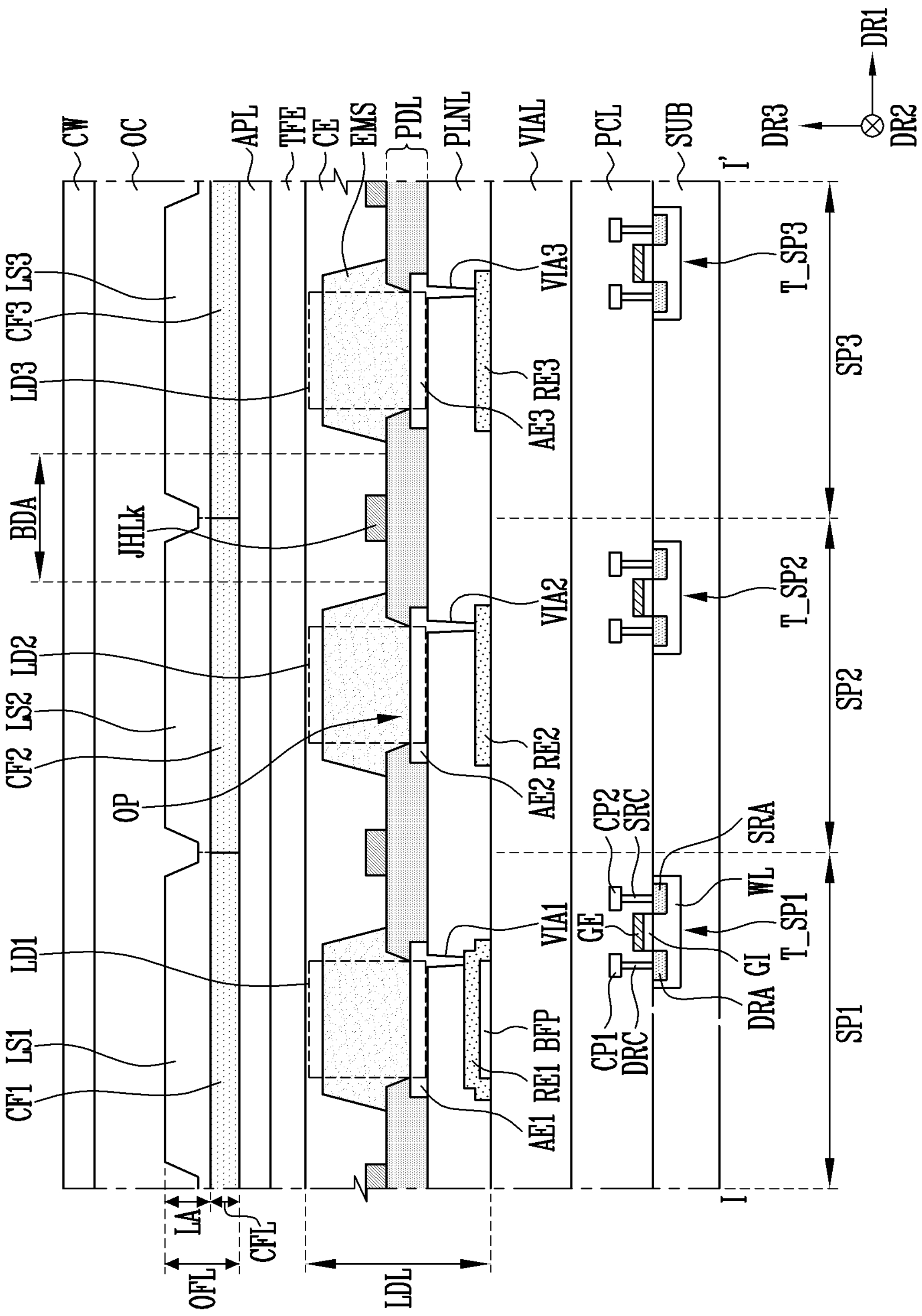
FIG. 8 is a schematic cross-sectional view taken along line I-I' of FIG. 5.

FIG. 8 is a schematic cross-sectional view taken along line I-I' of FIG. 5.

Referring to FIG. 8, the substrate SUB and the pixel circuit layer PCL disposed on the substrate SUB are provided.

The substrate SUB may include a silicon wafer substrate formed using a semiconductor process. For example, the substrate SUB may include silicon, germanium, and/or silicon-germanium.

The pixel circuit layer PCL is disposed on the substrate SUB. The substrate SUB and the pixel circuit layer PCL may include circuit elements of each of the first to third sub-pixels SP1 to SP3. For example, the substrate SUB and the pixel circuit layer PCL may include a transistor T_SP1 of the first sub-pixel SP1, a transistor T_SP2 of the second sub-pixel SP2, and a transistor T_SP3 of the third sub-pixel SP3. The transistor T_SP1 of the first sub-pixel SP1 may be any one of the transistors included in the sub-pixel circuit SPC (refer to FIG. 2) of the first sub-pixel SP1, the transistor T_SP2 of the second sub-pixel SP2 may be any one of the transistors included in the sub-pixel circuit SPC of the second sub-pixel SP2, and the transistor T_SP3 of the third sub-pixel SP3 may be any one of the transistors included in the sub-pixel circuit SPC of the third sub-pixel SP3. In FIG. 8, for clear and concise description, one of the transistors of each sub-pixel is shown, and the remaining circuit elements are omitted.

The transistor T_SP1 of the first sub-pixel SP1 may include a source area SRA, a drain area DRA, and a gate electrode GE.

The source area SRA and drain area DRA may be disposed in the substrate SUB. A well WL formed through an ion injection process may be disposed in the substrate SUB, and the source area SRA and the drain area DRA may be disposed to be spaced apart from each other in the well WL. An area between the source area SRA and the drain area DRA in the well WL may be defined as a channel area.

The gate electrode GE may overlap the channel area between the source area SRA and the drain area DRA and may be disposed in the pixel circuit layer PCL. The gate electrode GE may be spaced apart from the well WL or the channel area by an insulating material such as a gate insulating layer GI. The gate electrode GE may include a conductive material.

Layers included in the pixel circuit layer PCL may include insulating layers and conductive patterns disposed between the insulating layers, and such conductive patterns may include first and second conductive patterns CP1 and CP2. The first conductive pattern CP1 may be electrically connected to the drain area DRA through a drain connection portion DRC passing through one or more insulating layers. The second conductive pattern CP2 may be electrically connected to the source area SRA through a source connection portion SRC passing through one or more insulating layers.

As the gate electrode GE and the first and second conductive patterns CP1 and CP2 are connected to different circuit elements and/or lines, the transistor T_SP1 of the first sub-pixel SP1 may be provided as any one of the transistors of the first sub-pixel SP1.

Each of the transistor T_SP2 of the second sub-pixel SP2 and the transistor T_SP3 of the third sub-pixel SP3 may be formed similar to the transistor T_SP1 of the first sub-pixel SP1.

A via layer VIAL is disposed on the pixel circuit layer PCL. The via layer VIAL may cover the pixel circuit layer PCL and may have an overall flat surface. The via layer VIAL is formed to planarize steps on the pixel circuit layer PCL. The via layer VIAL may include at least one of silicon oxide ($SiO_x$), silicon nitride ($SiN_x$), and silicon carbon nitride (SiCN), but embodiments are not limited thereto.

The light emitting element layer LDL is disposed on the via layer VIAL. The light emitting element layer LDL may include first to third reflective electrodes RE1 to RE3, a planarization layer PLNL, first to third anode electrodes AE1 to AE3, the pixel defining layer PDL, the light emitting structure EMS, and the cathode electrode CE.

On the via layer VIAL, the first to third reflective electrodes RE1 to RE3 are disposed in the first to third sub-pixels SP1 to SP3, respectively. Each of the first to third reflective electrodes RE1 to RE3 may contact the circuit element disposed in the pixel circuit layer PCL through a via passing through the via layer VIAL.

The first to third reflective electrodes RE1 to RE3 may function as a full mirror reflecting the light emitted from the light emitting structure EMS toward the display surface (or the cover window CW). The first to third reflective electrodes RE1 to RE3 may include metal materials suitable for reflecting light. The first to third reflective electrodes RE1 to RE3 may include at least one of aluminum (Al), silver (Ag), magnesium (Mg), platinum (Pt), palladium (Pd), gold (Au), nickel (Ni), neodymium (Nd), iridium (Ir), chromium (Cr), titanium (Ti), and an alloy of two or more materials selected from them, but embodiments are not limited thereto.

In embodiments, a connection electrode may be disposed under or below each of the first to third reflective electrodes RE1 to RE3. The connection electrode may improve an electrical connection characteristic between a corresponding reflective electrode and the circuit element of the pixel circuit layer PCL. The connection electrode may have a multilayer structure. The multilayer structure may include titanium (Ti), titanium nitride (TiN), tantalum nitride (TaN), or the like, but embodiments are not limited thereto. In embodiments, a corresponding reflective electrode may be positioned between multiple layers of the connection electrode.

A buffer pattern BFP may be disposed under or below at least one of the first to third reflective electrodes RE1 to RE3. The buffer pattern BFP may include an inorganic material such as silicon carbon nitride, but embodiments are not limited thereto. By disposing the buffer pattern BFP, a height of the third direction DR3 of a corresponding reflective electrode may be adjusted. For example, the buffer pattern BFP may be disposed between the first reflective electrode RE1 and the via layer VIAL to adjust a height of the first reflective electrode RE1.

The first to third reflective electrodes RE1 to RE3 may function as full mirrors, and the cathode electrode CE may function as a half mirror. The light emitted from the light emitting layer of the light emitting structure EMS may be amplified by at least partially reciprocating between a corresponding reflective electrode and the cathode electrode CE, and the amplified light may be output through the cathode electrode CE. As described above, a distance between each reflective electrode and the cathode electrode CE may be understood as a resonance distance for the light emitted from the light emitting layer of the corresponding light emitting structure EMS.

The first sub-pixel SP1 may have a resonance distance shorter than that of another sub-pixel by the buffer pattern BFP. The resonance distance adjusted as described above may allow light of a given wavelength range (for example, red color) to be effectively and efficiently amplified. Accordingly, the first sub-pixel SP1 may effectively and efficiently output light of a corresponding wavelength range.

In FIG. 8, the buffer pattern BFP is provided to the first sub-pixel SP1 and is not provided to the second and third sub-pixels SP2 and SP3, but embodiments are not limited thereto. The buffer pattern may also be provided to at least one of the second and third sub-pixels SP2 and SP3 to adjust the resonance distance of at least one of the second and third sub-pixels SP2 and SP3. For example, the buffer pattern BFP may also be provided to the second sub-pixel SP2, and the resonance distance of the second sub-pixel SP2 may be adjusted. For example, the first to third sub-pixels SP1 to SP3 may correspond to red, green, and blue, respectively, a distance between the first reflective electrode RE1 and the cathode electrode CE may be shorter than a distance between the second reflective electrode RE2 and the cathode electrode CE, and the distance between the second reflective electrode RE2 and the cathode electrode CE may be shorter than a distance between the third reflective electrode RE3 and the cathode electrode CE.

In order to planarize steps between the first to third reflective electrodes RE1 to RE3, a planarization layer PLNL may be disposed on the via layer VIAL and the first to third reflective electrodes RE1 to RE3. The planarization layer PLNL may generally cover the first to third reflective electrodes RE1 to RE3 and the via layer VIAL, and may have a flat surface. In embodiments, the planarization layer PLNL may be omitted.

On the planarization layer PLNL, the first to third anode electrodes AE1 to AE3 respectively overlapping the first to third reflective electrodes RE1 to RE3 are disposed. The first to third anode electrodes AE1 to AE3 may have shapes similar to those of the first to third emission areas EMA1 to EMA3 of FIG. 5 when viewed in the third direction DR3. The first to third anode electrodes AE1 to AE3 are respectively connected to the first to third reflective electrodes RE1 to RE3. The first anode electrode AE1 may be connected to the first reflective electrode RE1 through a first via VIA1 passing through the planarization layer PLNL. The second anode electrode AE2 may be connected to the second reflective electrode RE2 through a second via VIA2 passing through the planarization layer PLNL. The third anode electrode AE3 may be connected to the third reflective electrode RE3 through a third via VIA3 passing through the planarization layer PLNL.

In embodiments, the first to third anode electrodes AE1 to AE3 may include at least one of transparent conductive materials such as indium tin oxide (ITO), indium zinc oxide (IZO), zinc oxide (ZnOx), indium gallium zinc oxide (IGZO), and indium tin zinc oxide (ITZO). However, a material of the first to third anode electrodes AE1 to AE3 is not limited thereto. For example, the first to third anode electrodes AE1 to AE3 may include titanium nitride.

In embodiments, insulating layers for adjusting a height of one or more of the first to third anode electrodes AE1 to AE3 may be further provided. The insulating layers may be disposed between at least one of the first to third anode electrodes AE1 to AE3 and a corresponding reflective electrode. In this case, the planarization layer PLNL and/or the buffer pattern BFP may be omitted. For example, the first to third sub-pixels SP1 to SP3 may correspond to red, green, and blue, respectively, a distance between the first anode electrode AE1 and the cathode electrode CE may be shorter than a distance between the second anode electrode AE2 and the cathode electrode CE, and the distance between the second anode electrode AE2 and the cathode electrode CE may be shorter than a distance between the third anode electrode AE3 and the cathode electrode CE. The pixel defining layer PDL is disposed on portions of the first to third anode electrodes AE1 to AE3 and the planarization layer PLNL. The pixel defining layer PDL may include an opening OP exposing a portion of each of the first to third anode electrodes AE1 to AE3. The opening OP of the pixel defining layer PDL may define the emission area of each of the first to third sub-pixels SP1 to SP3. As described above, the pixel defining layer PDL may be disposed in the non-emission area NEA of FIG. 5 and may define the first to third emission areas EMA1 to EMA3 of FIG. 5.

In embodiments, the pixel defining layer PDL may include inorganic insulating layers. Each of the inorganic insulating layers may include at least one of silicon oxide ($SiO_x$) and silicon nitride ($SiN_x$). For example, the pixel defining layer PDL may include sequentially stacked insulating layers, and each of the insulating layers may include silicon nitride, silicon oxide, and silicon nitride. However, embodiments are not limited thereto. The insulating layers may have a cross section of a step shape in an area adjacent to the opening OP.

The metal line JHLk may be provided in a boundary area BDA sub-pixels adjacent to each other. Each of the metal lines JHL1, JHL2, JHL3, . . . , and JHLo including the metal line JHLk may be positioned on the pixel defining layer PDL (refer to FIG. 3).

Each of the metal lines JHL1 to JHLo including the metal line JHLk may contact the cathode electrode CE of the light emitting elements of the sub-pixels SP in the display area DA. For example, the metal lines JHL1 to JHLo may sublimate a portion of the light emitting structure EMS positioned nearby by dissipating heat by Joule heating after the light emitting structure EMS is stacked. In a case of the light emitting structure EMS of FIG. 6, as the Joule heating process is performed after all of the first light emitting unit EU1, the charge generation layer CGL, and the second light emitting unit EU2 may be stacked each other, the light emitting structure EMS may not remain on the metal line JHLk. In a case of the light emitting structure EMS of FIG. 7, as the Joule heating process is performed after all of the first light emitting unit EU1', the first charge generation layer CGL1', the second light emitting unit EU2', the second charge generation layer CGL2, and the third light emitting unit EU3' may be stacked each other, the light emitting structure EMS' may not remain on the metal line JHLk. Therefore, a leakage current through portions of the light emitting structure EMS disconnected due to the metal lines JHL1 to JHLo may be prevented. The metal lines JHL1 to JHLo may be exposed to an outside of the light emitting structure EMS and may contact the cathode electrode CE that is subsequently deposited.

The light emitting structure EMS may be disposed on the anode electrodes AE exposed by the opening OP of the pixel defining layer PDL. In embodiments, the light emitting structure EMS may be formed through process such as vacuum deposition and inkjet printing. The light emitting structure EMS may fill the opening OP of the pixel defining layer PDL and may be disposed entirely across the first to third sub-pixels SP1 to SP3. As described above, the light emitting structure EMS may be at least partially disconnected in the boundary area BDA by the metal line JHLk. Accordingly, in case that the display panel DP is operated, a current leaked from each of the first to third sub-pixels SP1 to SP3 to a sub-pixel adjacent thereto through layers included in the light emitting structure EMS may decrease. Therefore, the first to third light emitting elements LD1 to LD3 may operate with relatively high reliability. However, in case that a voltage having a high voltage level is applied to the first metal pad JPD1, damage may occur in the sub-pixels SP adjacent to the metal lines JHL1 to JHLo.

The cathode electrode CE may be disposed on the light emitting structure EMS. The cathode electrode CE may be commonly provided to the first to third sub-pixels SP1 to SP3. The cathode electrode CE may function as a half mirror that partially transmits and partially reflects the light emitted from the light emitting structure EMS.

The first anode electrode AE1, a portion of the light emitting structure EMS overlapping the first anode electrode AE1, and a portion of the cathode electrode CE overlapping the first anode electrode AE1 may form the first light emitting element LD1. The second anode electrode AE2, a portion of the light emitting structure EMS overlapping the second anode electrode AE2, and a portion of the cathode electrode CE overlapping the second anode electrode AE2 may form the second light emitting element LD2. The third anode electrode AE3, a portion of the light emitting structure EMS overlapping the third anode electrode AE3, and a portion of the cathode electrode CE overlapping the third anode electrode AE3 may form the third light emitting element LD3.

The encapsulation layer TFE is disposed on the cathode electrode CE. The encapsulation layer TFE may prevent oxygen, moisture, and/or the like from permeating to the light emitting element layer LDL.

The optical functional layer OFL is disposed on the encapsulation layer TFE. In embodiments, the optical functional layer OFL may be attached to the encapsulation layer TFE through an adhesive layer APL. For example, the optical functional layer OFL may be separately manufactured and attached to the encapsulation layer TFE through the adhesive layer APL. The adhesive layer APL may further perform a function of protecting lower layers including the encapsulation layer TFE.

The optical functional layer OFL may include the color filter layer CFL and the lens array LA. The color filter layer CFL may include first to third color filters CF1 to CF3 respectively corresponding to the first to third sub-pixels SP1 to SP3. The first to third color filters CF1 to CF3 may pass light of different wavelength ranges. For example, the first to third color filters CF1 to CF3 may pass light of red, green, and blue colors, respectively.

In embodiments, the first to third color filters CF1 to CF3 may partially overlap in the boundary area BDA. In other embodiments, the first to third color filters CF1 to CF3 may be spaced apart from each other, and a black matrix may be provided between the first to third color filters CF1 to CF3.

The lens array LA is disposed on the color filter layer CFL. The lens array LA may include first to third lenses LS1 to LS3 respectively corresponding to the first to third sub-pixels SP1 to SP3. Each of the first to third lenses LS1 to LS3 may improve light output efficiency by outputting light emitted from the first to third light emitting elements LD1 to LD3 to an intended path.

Figure 9:
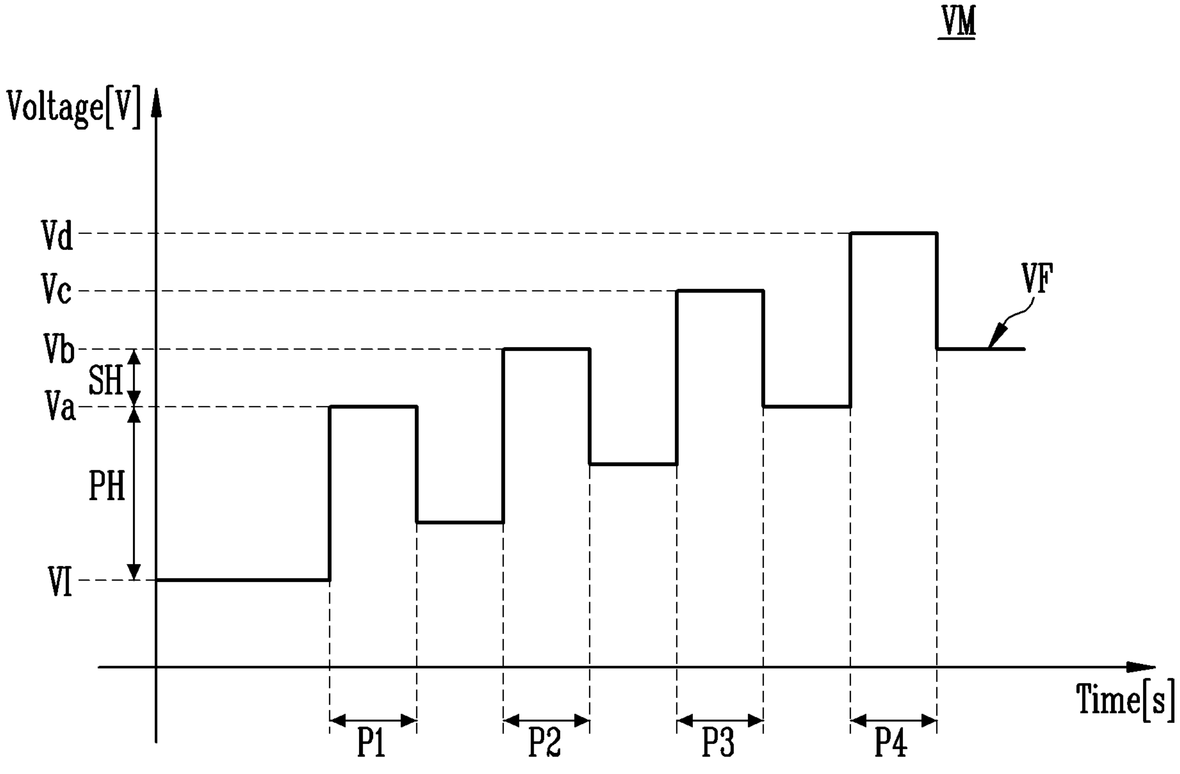
FIG. 9 is a diagram illustrating a voltage applied to a first metal pad.

FIG. 9 is a diagram illustrating a voltage applied to the first metal pad JPD1.

Referring to FIG. 9, a waveform of the voltage VM applied to the first metal pad JPD1 is shown. Referring to first to fourth time periods P1 to P4, the voltage VM may have pulses and a voltage level may gradually increase. In embodiments, the voltage VM may be applied to the metal lines JHL1 to JHLo through the first metal pad JPD1.

For example, a pulse applied to the first metal pad JPD1 during the first time period P1 may have a first voltage level Va, and a pulse applied to the first metal pad JPD1 during the second time period P2 may have a second voltage level Vb increased by a step voltage value SH from the first voltage level Va. A pulse applied to the first metal pad JPD1 during the third time period P3 may have a third voltage level Vc increased by the step voltage value SH from the second voltage level Vb. A pulse applied to the first metal pad JPD1 during the fourth time period P4 may have a fourth voltage level Vd increased by the step voltage value SH from the third voltage level Vc.

Accordingly, the voltage VM applied to the first metal pad JPD1 may increase from an initial voltage level VI to a final voltage level VF. The final voltage level VF may be a voltage level that is required to be applied to the first metal pad JPD1 to reach a target temperature.

In embodiments, a pulse amplitude of each of the pulses applied to the first to fourth time periods P1 to P4 may have a reference amplitude value PH.

As shown in FIG. 9, as the voltage increased by the step voltage value SH for each pulse is applied to the first metal pad JPD1, a value, which is lower than a value of a pulse amplitude required to previously reach the final voltage level VF, may be required. Accordingly, damage to the sub-pixels adjacent to the metal lines JHL1 to JHLo may be reduced.

Referring to FIG. 9, the voltage VM is shown as including four pulses, but the disclosure is not limited thereto, and the number of pulses included in the voltage VM may be determined based on a temperature at which the light emitting element LD of FIG. 2 is damaged, a thickness of the pixel defining layer PDL of FIG. 8, and a critical dimension of the metal lines JHL1 to JHLo.

Figure 10:
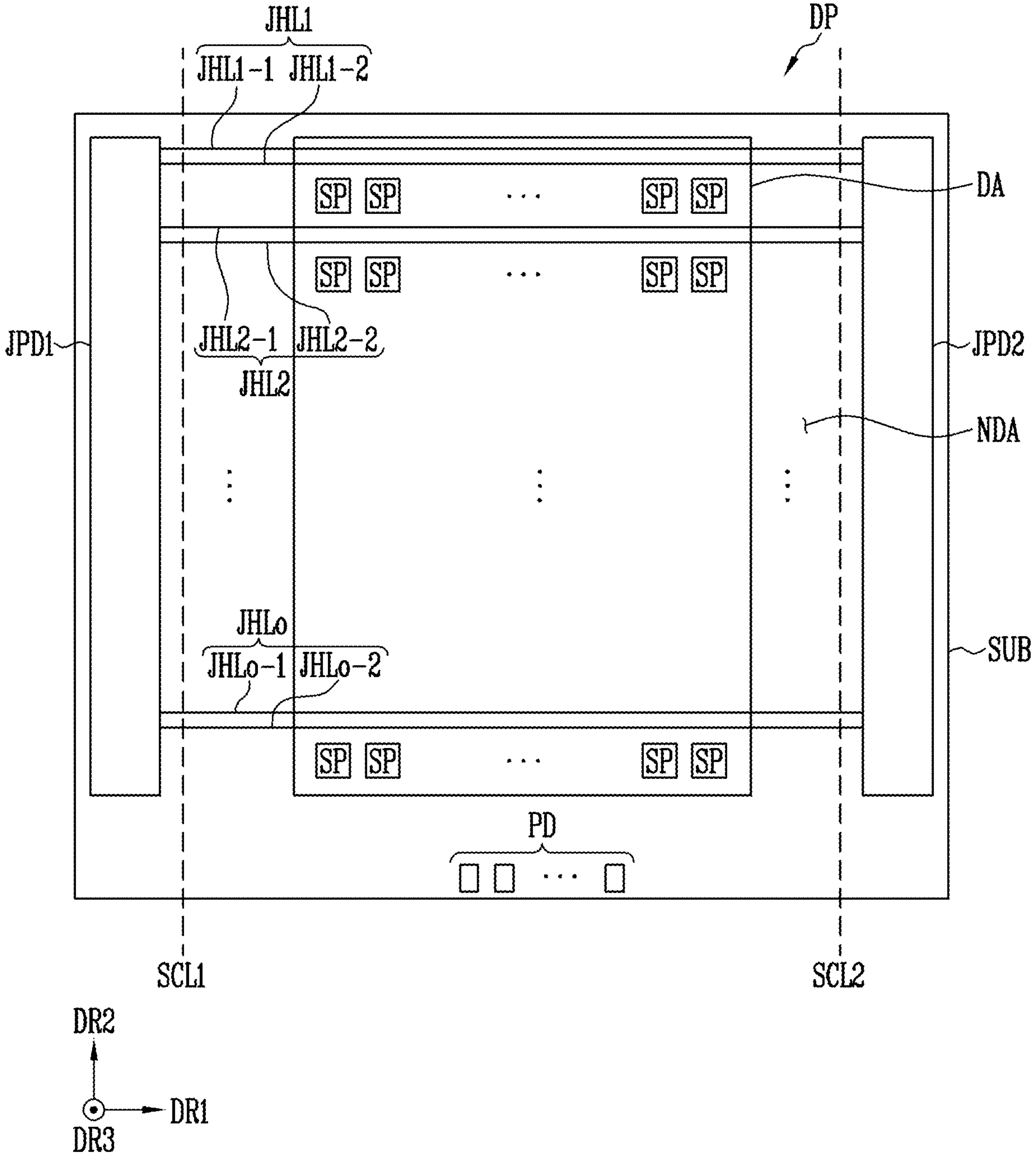
FIG. 10 is a schematic plan view illustrating an embodiment of the display panel of FIG. 1.

FIG. 10 is a schematic plan view illustrating an embodiment of the display panel of FIG. 1.

Referring to FIG. 10, each of the metal lines JHL1 to JHLo may include two sub-metal lines. Since the display panel DP of FIG. 10 is similar to the display panel DP of FIG. 3, an overlapping description may be omitted.

Each of the metal lines JHL1 to JHLo may include two sub-metal lines. For example, the first metal line JHL1 may include a first sub-metal line JHL1-1 and a second sub-metal line JHL1-2, the second metal line JHL2 may include a first sub-metal line JHL2-1 and a second sub-metal line JHL2-2, and the o-th metal line JHLo may include a first sub-metal line JHLo-1 and a second sub-metal line JHLo-2.

The first sub-metal lines JHL1-1 to JHLo-1 and the second sub-metal lines JHL1-2 to JHLo-2 may cross the non-display area NDA and the display area DA, and may extend so as not to overlap the emission areas of the sub-pixels SP in the display area DA. For example, the first sub-metal lines JHL1-1 to JHLo-1 and the second sub-metal lines JHL1-2 to JHLo-2 may connect the first metal pad JPD1 and the second metal pad JPD2 similarly to the metal lines JHL1 to JHLo of FIG. 3.

Referring to FIG. 10, the first sub-metal lines JHL1-1 to JHLo-1 and the second sub-metal lines JHL1-2 to JHLo-2 are shown to be spaced apart on a plane, but this is for convenience of illustration, and the first sub-metal lines JHL1-1 to JHLo-1 and the second sub-metal lines JHL1-2 to JHLo-2 may be disposed vertically along the third direction DR3.

Since each of the metal lines JHL1 to JHLo may include two sub-metal lines, even though a power voltage having a voltage level lower than that of a case where each of the metal lines JHL1 to JHLo does not include sub-metal lines is applied to the first metal pad JPD1, the temperature at which the organic material adjacent to the metal lines JHL1 to JHLo is sublimated may be reached. Accordingly, damage to the sub-pixels adjacent to the metal lines JHL1 to JHLo may be reduced.

Referring to FIG. 10, the first metal pad JPD1 is connected to one end or an end of each of the first sub-metal lines JHL1-1 to JHLo-1 and one end or an end of each of the second sub-metal lines JHL1-2 to JHLo-2, but the disclosure is not limited thereto, and the first metal pad JPD1 may be divided and may be connected to the one end or an end of each of the first sub-metal lines JHL1-1 to JHLo-1 and the one end or an end of each of the second sub-metal lines JHL1-2 to JHLo-2.

For example, in case that the first metal pad JPD1 is divided into two, one of the divided pads may be connected to the one end or an end of each of the first sub-metal lines JHL1-1 to JHLo-1, and the other may be connected to the one end or an end of each of the second sub-metal lines JHL1-2 to JHLo-2.

Referring to FIG. 10, each of the metal lines JHL1 to JHLo is shown as including two sub-metal lines, but the disclosure is not limited thereto, and only a portion of the metal lines JHL1 to JHLo may include two sub-metal lines.

Figure 11:
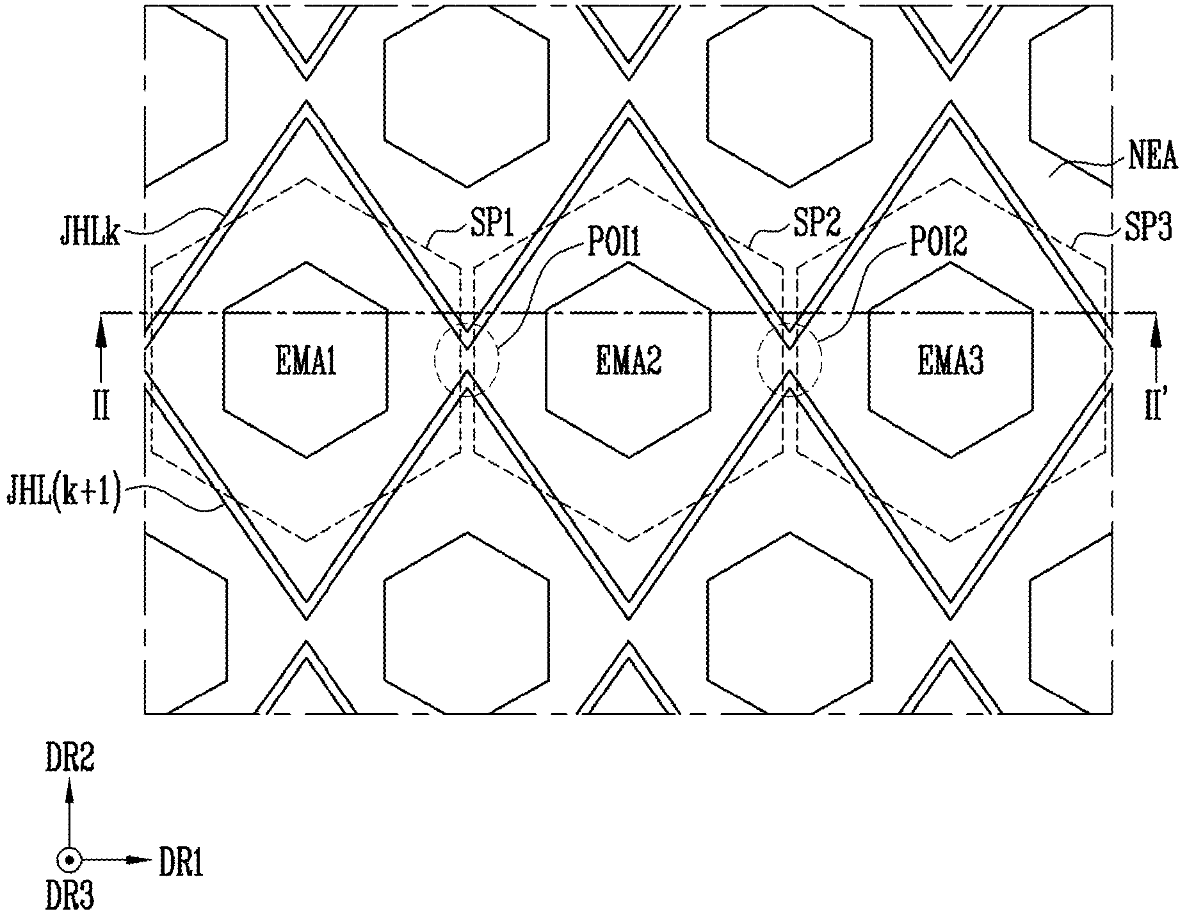
FIG. 11 is a schematic plan view illustrating a relationship of sub-pixels and metal lines.

FIG. 11 is a schematic plan view illustrating a relationship of the sub-pixels and the metal lines. Referring to FIG. 11, a schematic plan view of a display panel in which each of the metal lines JHL1 to JHLo may include two sub-metal lines is shown.

Since the first to third sub-pixels SP1, SP2, and SP3 of FIG. 11 are similar to the first to third sub-pixels SP1, SP2, and SP3 of FIG. 5, an overlapping description may be omitted.

Each of the metal lines JHLk and JHL(k+1) of FIG. 11 may include the first sub-metal line and the second sub-metal line disposed vertically in the third direction, similarly to the metal lines JHL1 to JHLo of FIG. 10.

The metal lines JHLk and JHL(k+1) may extend in the first direction DR1 and may have a shape surrounding the corresponding emission areas EMA1, EMA2, and EMA3. Since each of the metal lines JHLk and JHL(k+1) may include the first sub-metal line and the second sub-metal line, according to the embodiment, since an organic material existing in the areas POI1 and POI2 that do not overlap the metal lines JHLk and JHL(k+1) may also be sublimated by heat generated from four adjacent sub-metal lines, a leakage current through the organic material may be prevented.

Figure 12:
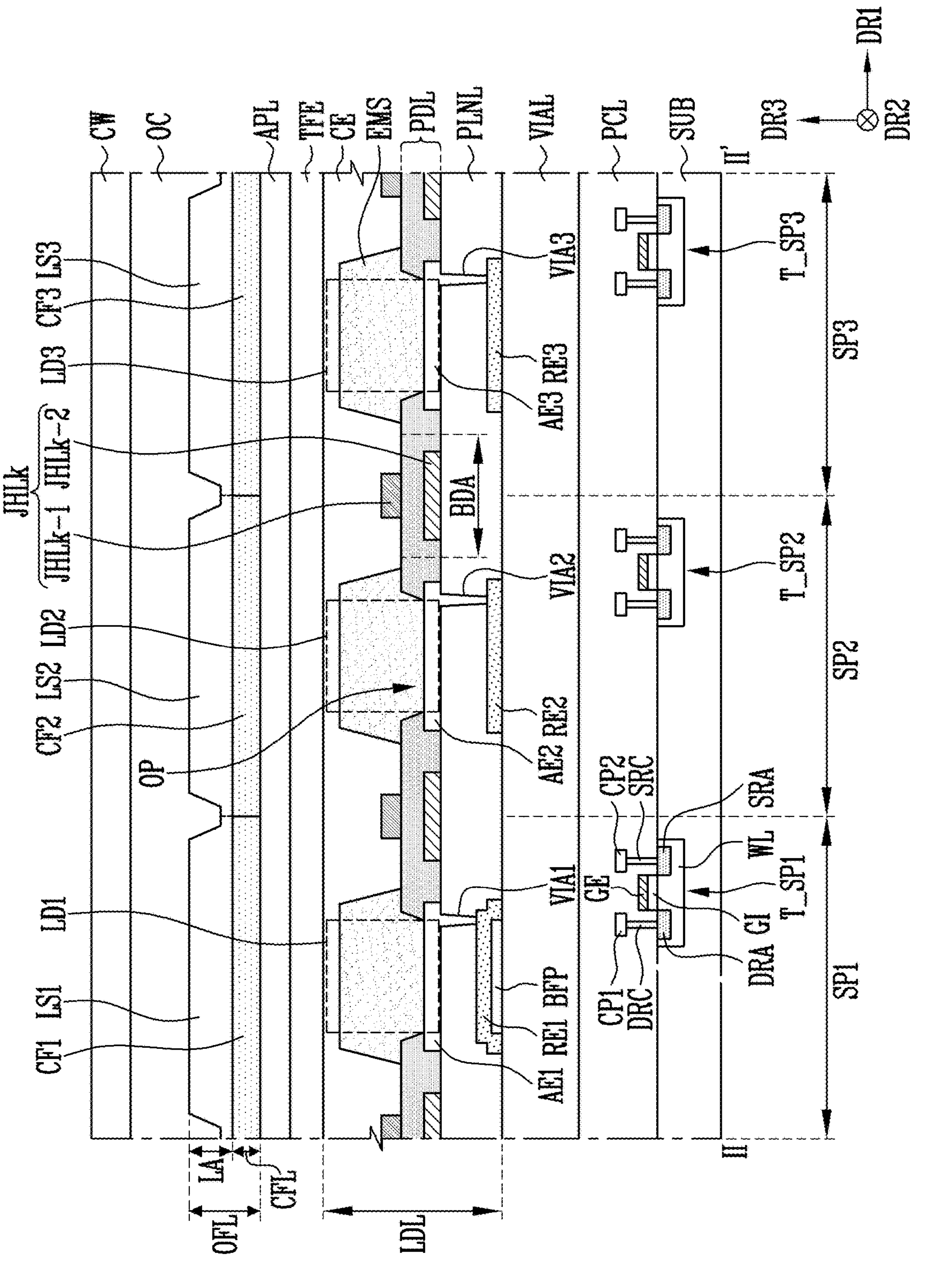
FIGS. 12 and 13 are schematic cross-sectional views taken along line II-II' of FIG. 11.
Figure 13:
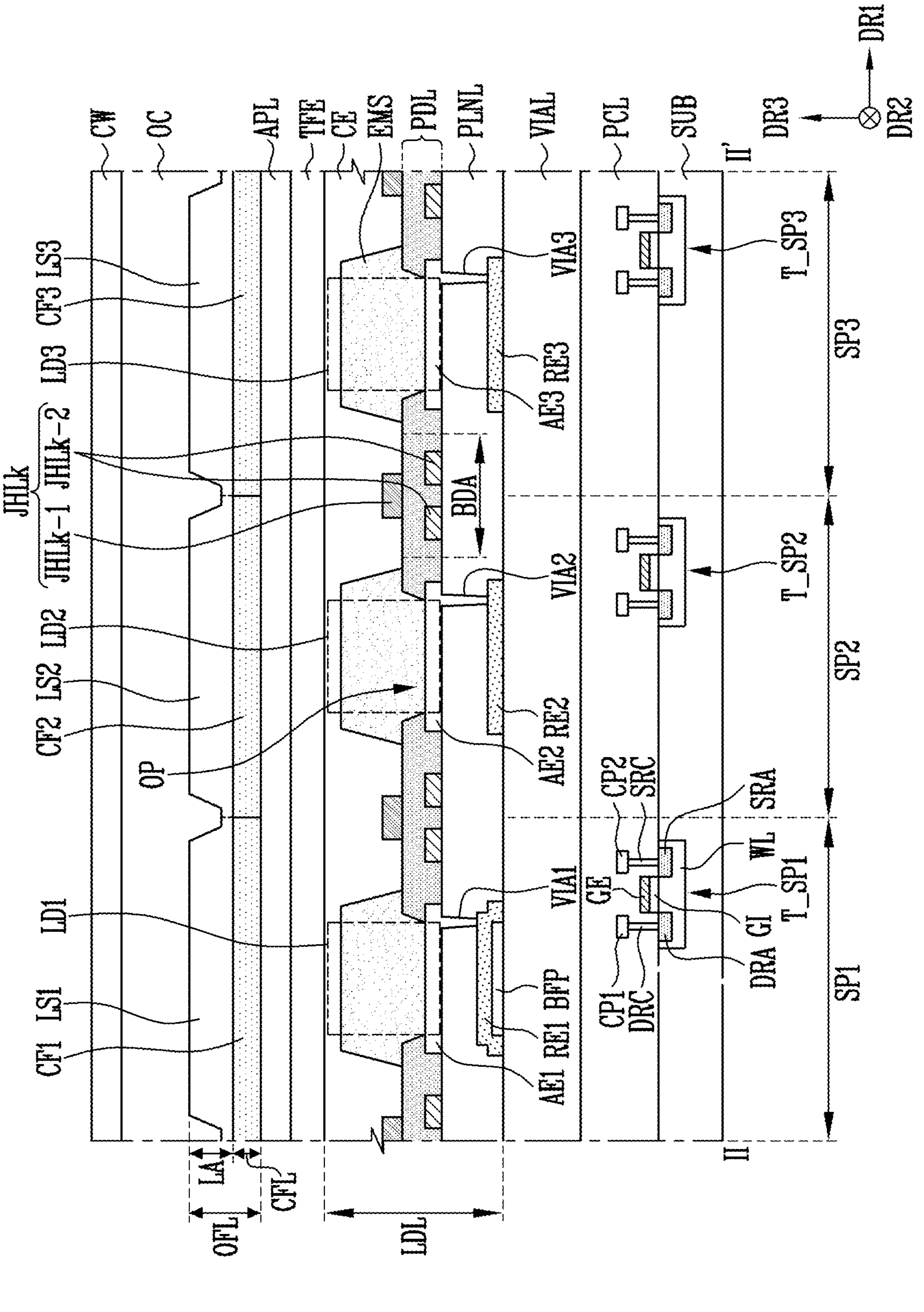

FIGS. 12 and 13 are schematic cross-sectional views taken along line II-II' of FIG. 11. Since the pixel circuit layer PCL, the substrate SUB, the via layer VIAL, the planarization layer PLNL, the encapsulation layer TFE, and the optical function layer OFL of FIGS. 12 and 13 are similar to the pixel circuit layer PCL, the substrate SUB, the via layer VIAL, the planarization layer PLNL, the encapsulation layer TFE, and the optical function layer OFL of FIG. 8, an overlapping description may be omitted.

Referring to FIG. 12, an embodiment of a display panel in which each of the metal lines JHL1 to JHLo may include two sub-metal lines is shown. First sub-metal lines JHLk-1 and second sub-metal lines JHLk-2 may be disposed along the vertical direction DR3 of the substrate SUB. The first sub-metal lines JHLk-1 may be disposed on the pixel defining layer PDL, and the second sub-metal lines JHLk-2 may be disposed inside the pixel defining layer PDL.

In embodiments, the second sub-metal lines JHLk-2 may be disposed in contact with an upper surface of the planarization layer PLNL. In other embodiments, the second sub-metal lines JHLk-2 may be disposed spaced apart from the planarization layer PLNL inside the pixel defining layer PDL.

In case that the planarization layer PLNL is omitted, the second sub-metal lines JHLk-2 may be disposed in contact with an upper surface of the via layer VIAL. In other embodiments, in case that the planarization layer PLNL is omitted, the second sub-metal lines JHLk-2 may be disposed spaced apart from the via layer VIAL inside the pixel defining layer PDL.

Referring to FIG. 13, an embodiment of a display panel in which each of the metal lines JHL1 to JHLo may include two sub-metal lines is shown. Referring to FIG. 13, the first sub-metal lines JHLk-1 may be disposed on the pixel defining layer PDL, and the second sub-metal lines JHLk-2 may be disposed inside the pixel defining layer PDL.

In more detail, each of the second sub-metal lines JHLk-2 may be formed of two lines. However, the disclosure is not limited thereto, and each of the second sub-metal lines JHLk-2 may be formed of lines.

Figure 14:
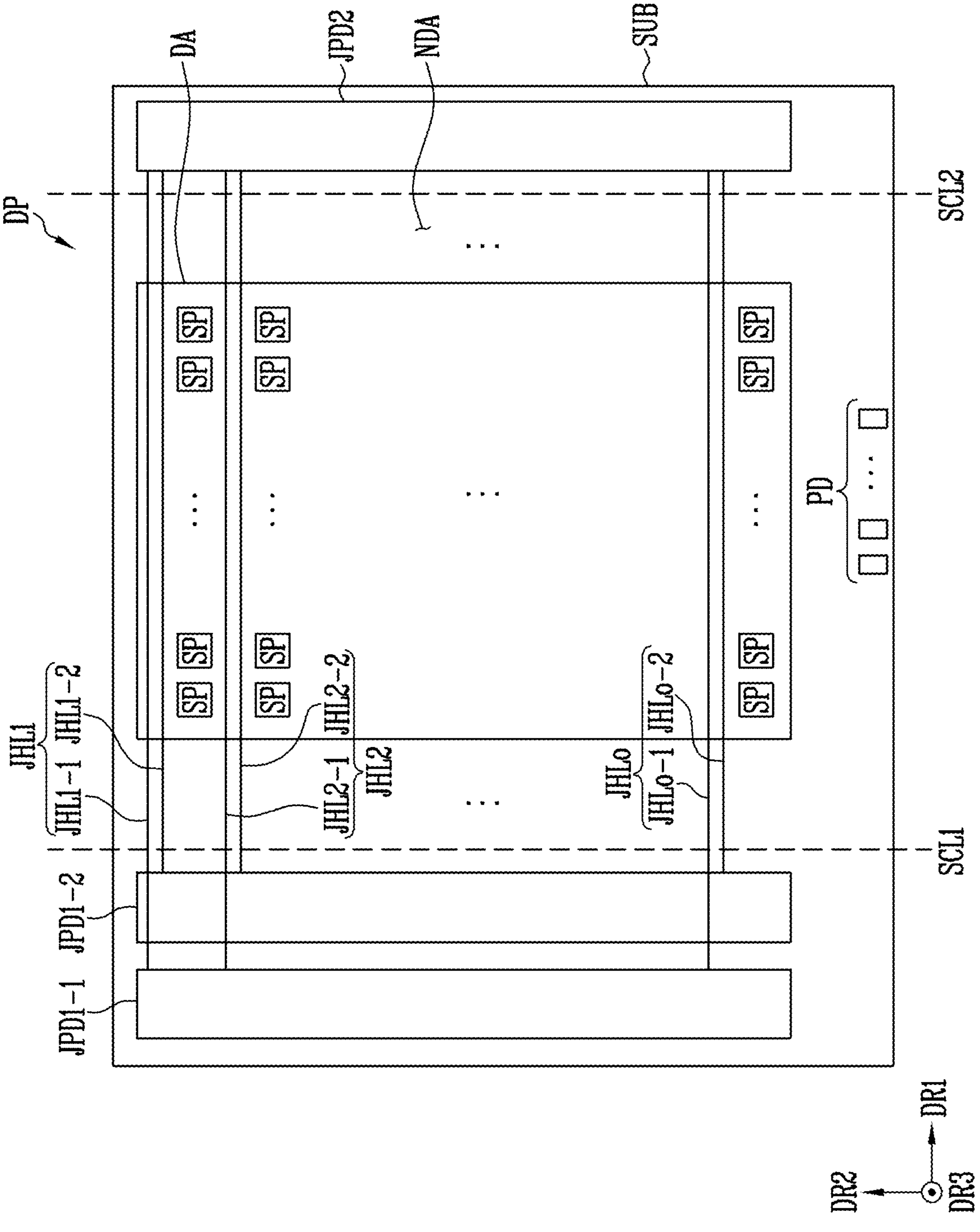
FIG. 14 is a schematic plan view illustrating an embodiment of the display panel of FIG. 1.

FIG. 14 is a schematic plan view illustrating an embodiment of the display panel of FIG. 1.

Referring to 14, a first sub-metal pad JPD1-1 and a second sub-metal pad JPD1-2 are shown. Since the display panel DP of FIG. 14 is similar to the display panel DP of FIG. 10, an overlapping description may be omitted.

One end or an end of the first sub-metal lines JHL1-1 to JHLo-1 may be connected to the first sub-metal pad JPD1-1, and one end or an end of the second sub-metal lines JHL1-2 to JHLo-2 may be connected to the second sub-metal pad JPD1-2.

Separate voltages may be applied to the first sub-metal pad JPD1-1 and the second sub-metal pad JPD1-2. For example, a voltage including a single pulse may be applied to the first sub-metal lines JHL1-1 to JHLo-1, and a voltage including pulses as shown in FIG. 9 may be applied to the second sub-metal lines JHL1-2 to JHLo-2.

A voltage including a single pulse may be applied to the second sub-metal lines JHL1-2 to JHLo-2, and a voltage including pulses as shown in FIG. 9 may be applied to the first sub-metal lines JHL1-1 to JHLo-1.

A voltage including a single pulse may be applied to both of the first sub-metal lines JHL1-1 to JHLo-1 and the second sub-metal lines JHL1-2 to JHLo-2, and a voltage including pulses as shown in FIG. 9 may be applied to both of the first sub-metal lines JHL1-1 to JHLo-1 and the second sub-metal lines JHL1-2 to JHLo-2.

Figure 15:
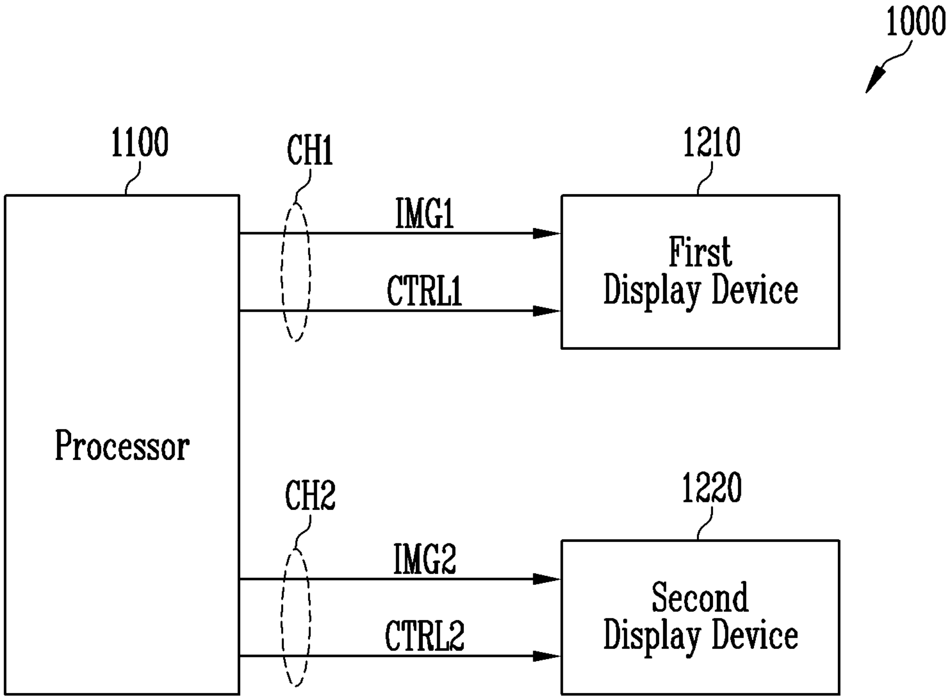
FIG. 15 is a block diagram illustrating an embodiment of a display system.

FIG. 15 is a block diagram illustrating an embodiment of a display system.

Referring to FIG. 15, the display system 1000 may include a processor 1100 and one or more display devices 1210 and 1220.

The processor 1100 may perform various tasks and calculations. In embodiments, the processor 1100 may include an application processor, a graphic processor, a microprocessor, a central processing unit (CPU), and the like within the spirit and the scope of the disclosure. The processor 1100 may be connected to other components of the display system 1000 through a bus system and may control the other components.

In FIG. 15, the display system 1000 may include the first and second display devices 1210 and 1220. The processor 1100 may be connected to the first display device 1210 through a first channel CH1 and may be connected to the second display device 1220 through a second channel CH2.

Through the first channel CH1, the processor 1100 may transmit first image data IMG1 and a first control signal CTRL1 to the first display device 1210. The first display device 1210 may display an image based on the first image data IMG1 and the first control signal CTRL1. The first display device 1210 may be formed similarly to the display device 100 described with reference to FIG. 1. In this case, the first image data IMG1 and the first control signal CTRL1 may be provided as the input image data IMG and the control signal CTRL of FIG. 1, respectively.

Through the second channel CH2, the processor 1100 may transmit second image data IMG2 and a second control signal CTRL2 to the second display device 1220. The second display device 1220 may display an image based on the second image data IMG2 and the second control signal CTRL2. The second display device 1220 may be formed similarly to the display device 100 described with reference to FIG. 1. In this case, the second image data IMG2 and the second control signal CTRL2 may be provided as the input image data IMG and the control signal CTRL of FIG. 1, respectively.

The display system 1000 may include a computing system providing an image display function, such as a portable computer, a mobile phone, a smart phone, a tablet personal computer (PC), a smart watch, a watch phone, a portable multimedia player (PMP), a navigation device, and an ultra mobile personal computer (UMPC). The display system 1000 may include at least one of a head mounted display (HMD) device, a virtual reality (VR) device, a mixed reality (MR) device, and an augmented reality (AR) device.

Figure 16:
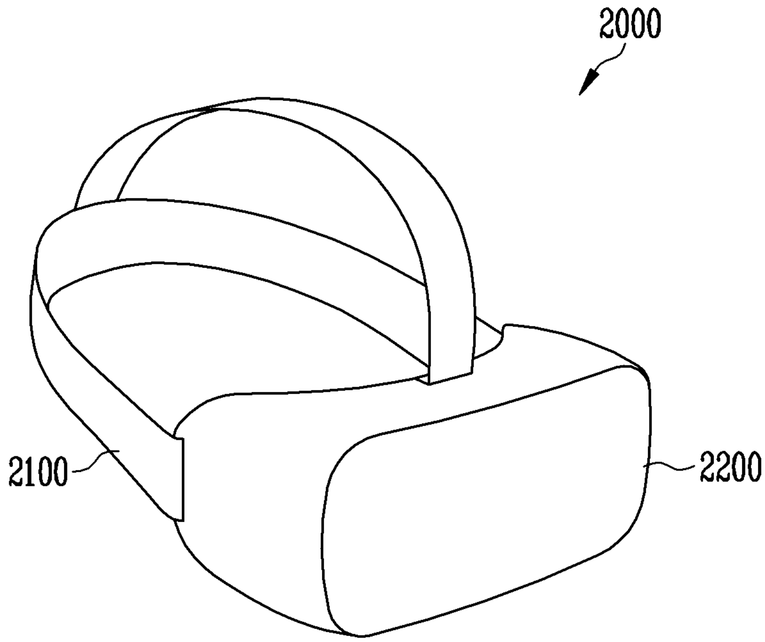
FIG. 16 is a schematic perspective view illustrating an application example of the display system of FIG. 15.

FIG. 16 is a schematic perspective view illustrating an application example of the display system of FIG. 15.

Referring to FIG. 16, the display system 1000 of FIG. 15 may be applied to a head mounted display device 2000. The head mounted display device 2000 may be a wearable electronic device that may be worn on a user's head.

The head mounted display device 2000 may include a head mount band 2100 and a display device accommodation case 2200. The head mount band 2100 may be connected to the display device accommodation case 2200. The head mount band 2100 may include a horizontal band and/or a vertical band for fixing the head mounted display device 2000 to the user's head. The horizontal band may be formed to surround a side portion of the user's head, and the vertical band may be formed to surround an upper portion of the user's head. However, embodiments are not limited thereto. For example, the head mount band 2100 may be implemented in a glasses frame form, a helmet form, or the like within the spirit and the scope of the disclosure.

The display device accommodation case 2200 may accommodate the first and second display devices 1210 and 1220 of FIG. 15. The display device accommodation case 2200 may further accommodate the processor 1100 of FIG. 15.

Figure 17:
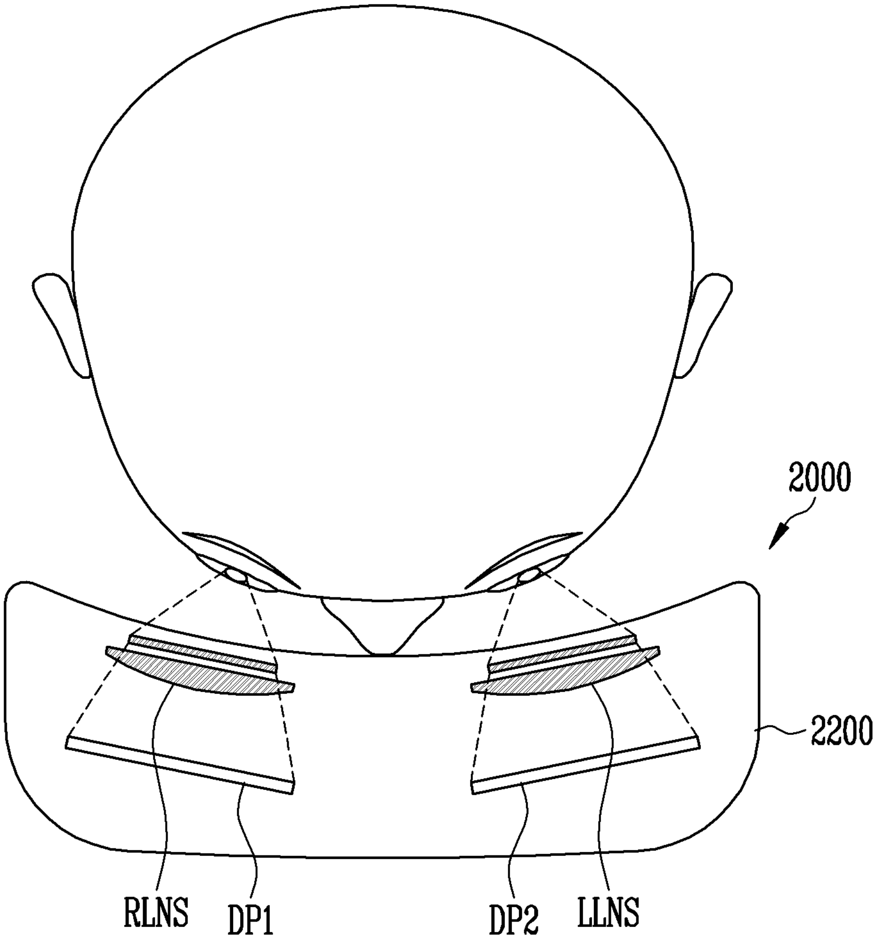
FIG. 17 is a diagram illustrating a head mounted display device worn by a user of FIG. 16.

FIG. 17 is a diagram illustrating the head mounted display device worn by a user of FIG. 16.

Referring to FIG. 17, in a head mounted display device 2000, a first display panel DP1 of the first display device 1210 and a second display panel DP2 of the second display device 1220 are disposed. The head mounted display device 2000 may further include one or more lenses LLNS and RLNS.

In the display device accommodation case 2200, the right eye lens RLNS may be disposed between the first display panel DP1 and a user's right eye. In the display device accommodation case 2200, the left eye lens LLNS may be disposed between the second display panel DP2 and a user's left eye.

An image output from the first display panel DP1 may be displayed to the user's right eye through the right eye lens RLNS. The right eye lens RLNS may refract light from the first display panel DP1 to be directed toward the user's right eye. The right eye lens RLNS may perform an optical function for adjusting a viewing distance between the first display panel DP1 and the user's right eye.

An image output from the second display panel DP2 may be displayed to the user's left eye through the left eye lens LLNS. The left eye lens LLNS may refract light from the second display panel DP2 to be directed toward the user's left eye. The left eye lens LLNS may perform an optical function for adjusting a viewing distance between the second display panel DP2 and the user's left eye.

In embodiments, each of the right eye lens RLNS and the left eye lens LLNS may include an optical lens having a pancake-shaped cross-section. In embodiments, each of the right eye lens RLNS and the left eye lens LLNS may include a multi-channel lens including sub-areas having different optical characteristics. In this case, each display panel may output images respectively corresponding to the sub-areas of the multi-channel lens, and the output images may pass through the respective corresponding sub-areas and may be viewed to the user.

The drawings referred to and the detailed description of the disclosure described herein are examples of the disclosure, are used for describing the disclosure, and are not intended to limit the meaning and the scope of the disclosure and as described in the claims. Therefore, those skilled in the art will understand that various modifications and equivalents other embodiments are possible from these. Thus, the true scope of the disclosure should be determined by the technical spirit of the appended claims.

What is claimed is:

1. A display device comprising:
a display area and a non-display area;
sub-pixels disposed in the display area; and
a metal line intersecting the non-display area and the display area and spaced apart from emission areas of the sub-pixels on a plane in the display area,
wherein a voltage including a plurality of pulses is applied to the metal line, peaks of successive pulses of the plurality of pulses having increasing voltages at intervals of a step voltage value.

2. The display device according to claim 1, wherein pulse amplitudes of the plurality of pulses are equal to each other.

3. The display device according to claim 1, further comprising:
a first metal pad disposed in the non-display area and electrically connected to an end of the metal line; and
a second metal pad disposed in the non-display area and electrically connected to another end of the metal line, wherein
the display area is disposed between the first metal pad and the second metal pad, and
the voltage including the plurality of pulses is applied to the metal line through the first metal pad.

4. The display device according to claim 1, wherein the metal line is disposed on a pixel defining layer that defines the emission areas of the sub-pixels in the display area.

5. The display device according to claim 4, wherein the metal line electrically contacts a cathode of a light emitting element of the sub-pixels.

6. The display device according to claim 1, wherein the display device is a head mounted display device.

7. A display device comprising:
a display area and a non-display area;
sub-pixels disposed in the display area; and
a first sub-metal line and a second sub-metal line intersecting the non-display area and the display area and spaced apart from emission areas of the sub-pixels on a plane in the display area,
wherein the first sub-metal line and the second sub-metal line are disposed on a substrate in a vertical direction orthogonal to the plane and overlap one another in the vertical direction.

8. The display device according to claim 7, wherein
the first sub-metal line is disposed on a pixel defining layer defining the emission areas of the sub-pixels in the display area, and
the second sub-metal line is disposed inside of the pixel defining layer.

9. The display device according to claim 8, further comprising:
a pixel circuit layer disposed on the substrate, the pixel circuit layer including a sub-pixel circuit of each of the sub-pixels;
a via layer disposed on the pixel circuit layer; and
a light emitting element layer disposed on the via layer, the light emitting element layer including the pixel defining layer,
wherein the second sub-metal line contacts an upper surface of the via layer.

10. The display device according to claim 8, further comprising:
a pixel circuit layer disposed on the substrate, the pixel circuit layer including a sub-pixel circuit of each of the sub-pixels;
a via layer disposed on the pixel circuit layer; and
a light emitting element layer disposed on the via layer, the light emitting element layer including the pixel defining layer,
wherein the second sub-metal line is spaced apart from the via layer and disposed inside of the pixel defining layer.

11. The display device according to claim 7, wherein the second sub-metal line is formed of a plurality of lines.

12. The display device according to claim 7, further comprising:
a first metal pad disposed in the non-display area and electrically connected to an end of the first sub-metal line and an end of the second sub-metal line; and
a second metal pad disposed in the non-display area and electrically connected to another end of the first sub-metal line and another end of the second sub-metal line,
wherein the display area is disposed between the first metal pad and the second metal pad.

13. The display device according to claim 12, wherein
the first metal pad further includes a first sub-metal pad and a second sub-metal pad,
the end of the first sub-metal line is electrically connected to the first sub-metal pad,
the end of the second sub-metal line is electrically connected to the second sub-metal pad, and
separate voltages are applied to the first sub-metal pad and the second sub-metal pad.

14. The display device according to claim 13, wherein
a voltage including a plurality of pulses is applied to the first metal pad, and is increased by a step voltage value for each of pulses, and
a voltage including a single pulse is applied to the second metal pad.

15. The display device according to claim 7, wherein the first sub-metal line electrically contacts a cathode of light emitting elements of the sub-pixels.

16. The display device according to claim 7, wherein the display device is a head mounted display device.

17. An electronic device comprising:
a display device; and
a processor configured to control the display device,
wherein the display device comprising:
a display area and a non-display area;
sub-pixels disposed in the display area; and
a metal line intersecting the non-display area and the display area and spaced apart from emission areas of the sub-pixels on a plane in the display area,
wherein a voltage including a plurality of pulses is applied to the metal line, peaks of successive pulses of the plurality of pulses having increasing voltages at intervals of a step voltage value.

18. The electronic device according to claim 17, wherein pulse amplitudes of the plurality of pulses are equal to each other.

19. The electronic device according to claim 17, further comprising:
a first metal pad disposed in the non-display area and electrically connected to an end of the metal line; and
a second metal pad disposed in the non-display area and electrically connected to another end of the metal line, wherein the display area is disposed between the first metal pad and the second metal pad, and the voltage including the plurality of pulses is applied to the metal line through the first metal pad.

20. The electronic device according to claim 17, wherein the metal line is disposed on a pixel defining layer that defines the emission areas of the sub-pixels in the display area.

* * * * *